US005650608A

United States Patent [19]
Redford et al.

[11] Patent Number: 5,650,608
[45] Date of Patent: Jul. 22, 1997

[54] METHOD AND APPARATUS FOR GENERATING RATIOMETRIC CONTROL SIGNALS

[75] Inventors: Peter M. Redford, Los Gatos; Donald S. Stern, San Jose, both of Calif.

[73] Assignee: TV Interactive Data Corporation, San Jose, Calif.

[21] Appl. No.: 359,306

[22] Filed: Dec. 19, 1994

Related U.S. Application Data

[63] Continuation-in-part of Ser. No. 298,648, Aug. 31, 1994, and Ser. No. 280,699, Jul. 26, 1994, which is a continuation-in-part of Ser. No. 76,032, Jun. 15, 1993, Ser. No. 804,240, Dec. 5, 1991, Pat. No. 5,339,095, and Ser. No. 868,835, Apr. 15, 1992, Pat. No. 5,218,771.

[51] Int. Cl.$^6$ ................................................ H01J 40/14
[52] U.S. Cl. .................. 250/210; 250/208.2; 250/208.5; 356/222
[58] Field of Search .............................. 250/210, 208.2, 250/221, 239, 208.5; 356/222

[56] References Cited

U.S. PATENT DOCUMENTS

| | | | |
|---|---|---|---|
| 2,415,168 | 2/1947 | Giesake | 250/210 |
| 3,360,653 | 12/1967 | Phares | 250/208.5 |
| 3,371,424 | 3/1968 | Sweet . | |

(List continued on next page.)

FOREIGN PATENT DOCUMENTS

| | | |
|---|---|---|
| 841864 | 11/1989 | Finland . |
| 3236436 | 3/1984 | Germany . |
| 003303103A | 8/1984 | Germany . |
| 363063905A | 5/1986 | Japan . |
| 8500817 | 5/1986 | Netherlands . |
| 154030 | 3/1962 | U.S.S.R. . |
| 800637 | 1/1981 | U.S.S.R. . |
| 1244489 | 7/1986 | U.S.S.R. . |
| 2238382 | 5/1991 | United Kingdom . |
| WO90/13792 | 11/1990 | WIPO . |

OTHER PUBLICATIONS

Sakharov, A., "A High Precision Differential Photometer", *Instruments and Experimental Techniques*, vol. 16, No. 4, pp. 1222-1223, Jul./Aug. 1973 (Publ. Jan. 1974).

Horowitz and Hill, *The Art of Electronics*, pp. 164-165 (1988).

Excerpt from Texas Instruments, Inc. manual entitled TLC555M, TLC555I, TLC555C LinCMOS™ TIMERS; D2784, Sep. 1983—Revised Oct. 1988, p. 4-195.

(List continued on next page.)

*Primary Examiner*—Stephone Allen
*Attorney, Agent, or Firm*—Skjerven, Morrill, MacPherson, Franklin & Friel; Alan H. MacPherson; Omkar K. Suryadevara

[57] ABSTRACT

A ratiometric sensor is formed of a first photodiode connected in series with an electronic component, such as a second photodiode or a resistor, between a source of first voltage and a source of second voltage. The ratiometric sensor supplies a "ratiometric voltage" on a ratiometric sensor output line that is connected to a junction between the first photodiode and the electronic component. The ratiometric voltage is proportional to the ratio of the equivalent resistance of the first photodiode to the sum of the equivalent resistances of the first photodiode and the electronic component. A ratiometric sensor that uses a photodiode and a resistance has a large dynamic range because the ratiometric voltage can vary between the first voltage and the second voltage. A ratiometric sensor that uses two photodiodes is less sensitive to noise than a conventional circuit that uses a single photodiode, because noise can get canceled from the numerator and denominator of the ratio. The ratiometric signal can be digitized by an analog-to-digital converter that can include, for example, a 555 timer, a Darlington transistor or a combination of a resistor and a capacitor.

15 Claims, 15 Drawing Sheets

Microfiche Appendix Included
(2 Microfiche, 43 Pages)

U.S. PATENT DOCUMENTS

| | | |
|---|---|---|
| 3,569,717 | 3/1971 | Awojobi et al. .................. 356/222 |
| 3,863,067 | 1/1975 | Gooley . |
| 4,040,743 | 8/1977 | Villaume et al. ............. 250/227.11 |
| 4,148,014 | 4/1979 | Burson .......................... 340/709 |
| 4,154,000 | 5/1979 | Kramer . |
| 4,316,155 | 2/1982 | Hanisko . |
| 4,430,526 | 2/1984 | Brown et al. . |
| 4,514,732 | 4/1985 | Hayes, Jr. .................. 340/825.57 |
| 4,565,999 | 1/1986 | King et al. ..................... 340/706 |
| 4,594,562 | 6/1986 | Gurke et al. . |
| 4,642,459 | 2/1987 | Caswell et al. . |
| 4,651,023 | 3/1987 | Parsonage ..................... 250/210 |
| 4,677,428 | 6/1987 | Bartholow . |
| 4,682,159 | 7/1987 | Davison . |
| 4,701,048 | 10/1987 | Tokuda et al. ................. 356/222 |
| 4,712,885 | 12/1987 | Dawson et al. ................ 350/443 |
| 4,746,879 | 5/1988 | Ma et al. . |
| 4,755,801 | 7/1988 | Gooley . |
| 4,787,051 | 11/1988 | Olson . |
| 4,839,838 | 6/1989 | La Biche et al. . |
| 4,862,172 | 8/1989 | Ross . |
| 4,864,647 | 9/1989 | Harrington . |
| 4,866,602 | 9/1989 | Hall . |
| 4,868,896 | 9/1989 | Pietzsch . |
| 4,883,926 | 11/1989 | Baldwin . |
| 4,939,482 | 7/1990 | Nergaard et al. . |
| 5,013,926 | 5/1991 | Aizawa . |
| 5,045,843 | 9/1991 | Hansen . |
| 5,059,958 | 10/1991 | Jacobs et al. . |
| 5,063,376 | 11/1991 | Chang . |
| 5,068,645 | 11/1991 | Drumm . |
| 5,086,197 | 2/1992 | Liou . |
| 5,096,650 | 3/1992 | Lowenstein .................... 250/210 |
| 5,097,353 | 3/1992 | Fujiwara et al. ............... 359/177 |
| 5,115,236 | 5/1992 | Kohler . |
| 5,117,099 | 5/1992 | Schmidt ...................... 250/208.2 |
| 5,142,655 | 8/1992 | Drumm . |
| 5,166,819 | 11/1992 | Eichel ......................... 250/214 A |
| 5,223,709 | 6/1993 | Pettypiece, Jr. ............... 250/229 |
| 5,288,078 | 2/1994 | Capper et al. . |
| 5,355,147 | 10/1994 | Lear ............................. 345/156 |
| 5,363,120 | 11/1994 | Drumm ......................... 345/158 |
| 5,459,489 | 10/1995 | Redford ........................ 345/179 |

OTHER PUBLICATIONS

Excerpt from Texas Instruments, Inc. manual entitled TLC556M, TLC556I, TLC556C DUAL LinCMOS™ TIMERS; D2796, Feb. 1984—Revised Oct. 1988, pp. 4–203 and 4–204.

*Analog Integrated Circuits Data Book, vol. 10,* Precision Monolithics, Inc., 1990, pp. 7–50 to 7–56.

Graeme, J., "Divide And Conquer Noise In Photodiode Amplifiers," *Electronic Design Analog Applications Issue,* Jun. 27, 1994, pp. 10, 12, 14, 16–18, 22, and 26.

Graeme, J., "Filtering Cuts Noise In Photodiode Amplifiers", *Electronic Design Analog Applications Issue,* Nov. 7, 1994, pp. 9–10, 12, 15–18, and 20–22.

METHOD AND APPARATUS FOR GENERATING RATIOMETRIC CONTROL SIGNALS

CROSS-REFERENCES TO RELATED APPLICATIONS

This application is a continuation-in-part of U.S. patent application Ser. No. 08/280,699, "Position Sensing Controller And Method For Generating Control Signals" filed Jul. 26, 1994, which is a continuation-in-part of (i) U.S. patent application Ser. No. 08/076,032 "Handheld Electronic Remote Control Device filed Jun. 15, 1993, (ii) U.S. patent application Ser. No. 07/804,240 "Multimedia Pointing Device" filed Dec. 5, 1991 and issued as U.S. Pat. No. 5,339,095, (iii) U.S. patent application Ser. No. 07/868,835, "Orientation Sensing Apparatus" filed Apr. 15, 1992 and issued as U.S. Pat. No. 5,218,771 on Jun. 15, 1993, all of which are incorporated herein in their entirety.

This application is also a continuation-in-part of U.S. patent application Ser. No. 08/298,648, "Infrared Communication Apparatus And Method Between A Controller And A Controlled Device", filed Aug. 31, 1994, which is also incorporated herein in its entirety.

This application is also related to concurrently filed, commonly owned and copending U.S. patent application Ser. No. 08/359,307 "Position Sensing Method and Apparatus" that is incorporated herein by reference in its entirety.

REFERENCE TO MICROFICHE APPENDIX

Microfiche Appendices A (of 1 sheet and 26 frames) and B (of 1 sheet and 19 frames) list two variations of code for use in a microcontroller, are part of the present disclosure and are incorporated herein in their entirety.

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

FIELD OF THE INVENTION

This invention relates generally to a novel ratiometric sensor and in particular to the use of at least one photodiode and an electronic component in a voltage divider configuration to supply an analog ratiometric voltage.

BACKGROUND OF THE INVENTION

Conventional circuits that use the current supplied by a photodiode are prone to noise as described in, for example "Divide and conquer noise in photodiode amplifiers", Electronic Design, Analog Applications Issue, Jun. 27, 1994 or in "Filtering Cuts Noise in Photodiode Amplifiers," Electronic Design, Analog Applications Issue, Nov. 7, 1994.

A log ratio amplifier or an operational amplifier based circuit can reduce noise in conventional circuits. See for example, SSM-2100, as described in "Analog IC Data Book" Volume 10, available from Precision Monolithic Inc., 1500 Space Park Drive, P.O. Box 28020, Santa Clara, Calif. 95052-8020. See also "New Op. Amp Ideas" by Robert J. Widlar (FIG. 21 "Optoelectric Pyrometer with Transmitter A" at page 499), Linear Applications Databook, 1986, National Semiconductor Corporation, 2900 Semiconductor Drive, P.O. Box 58090, Santa Clara, Calif. 9505289-8090. However, such circuits are expensive as compared to methods and apparatuses described below.

Use of analog dividers is complicated and expensive as seen from "Part One: Basic Operations," Nonlinear Circuits Handbook, 1976, published by Analog Devices, Inc., Norwood, Mass. 02062, USA. See also "Monolithic Op Amp—The Universal Linear Component" by Robert J. Widlar, (FIG. 10, Analog multiplier/divider at page 11) in Linear Applications Data Book referenced above.

SUMMARY OF THE INVENTION

In accordance with this invention, a novel electrical device, hereinafter "ratiometric sensor" includes a first photodiode that is connected in a voltage divider configuration with an electronic component, such as a second photodiode or a resistor, between a source of a first voltage and a source of a second voltage. The ratiometric sensor supplies a ratiometric signal in the form of voltage, henceforth "ratiometric voltage", on a ratiometric sensor output line that is connected to a junction between the first photodiode and the electronic component. The ratiometric voltage is a voltage that is proportional to the ratio of the equivalent resistance of the first photodiode to the sum of the equivalent resistances of the first photodiode and the electronic component.

A ratiometric sensor that uses a resistance as the electronic component has a large dynamic range because the ratiometric voltage can vary between the first voltage and the second voltage. A ratiometric sensor that uses two photodiodes, henceforth a "balanced" ratiometric sensor, is less sensitive to noise than a ratiometric sensor that uses a single photodiode, because any noise that equally affects both the photodiodes has an equal effect on the numerator and the denominator of the ratio, and a common scaling factor gets canceled from the ratio. Due to the low sensitivity to noise, the ratiometric signal can be sampled with any predetermined degree of precision, depending on the needs of an application.

The ratiometric signal can drive an analog-to-digital converter that in turn supplies a pulse width modulated signal that can drive a microprocessor. The analog-to-digital converter can include, for example, a Darlington transistor, a 555 timer or a combination of resistor and a capacitor.

In one embodiment, in response to the amount of incident light, one or more photodiodes in a ratiometric sensor drive a ratiometric position signal that approximately indicates the position of a movable element of a position sensing controller, such as a video game controller or a joystick. The position signal can drive any electrically controllable device, such as a game machine, a personal computer or an interactive television set top.

DETAILED DESCRIPTION

Figure 1:
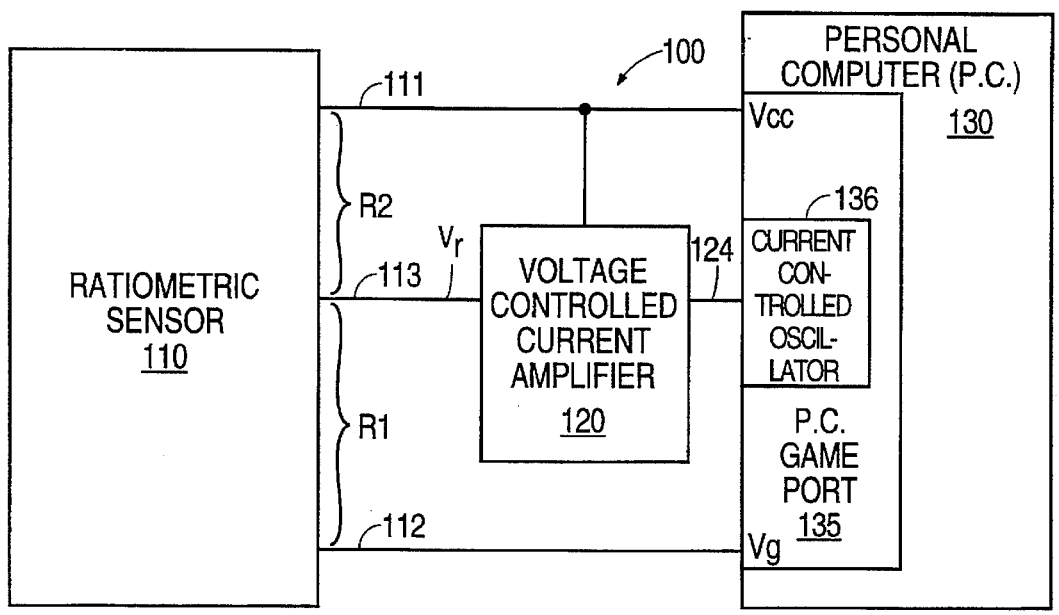
FIGS. 1 and 2A illustrate a high and low level block diagram of a ratiometric circuit that includes a ratiometric sensor.

A novel electrical device, henceforth "ratiometric sensor" 110 (FIG. 1) supplies, on a ratiometric sensor output line 113, a ratiometric signal having a ratiometric voltage Vr that is a voltage proportional to the ratio R1/(R1+R2), where R1 is an equivalent resistance of ratiometric sensor 110 between ratiometric sensor output line 113 and a first reference voltage line 112, and R2 is an equivalent resistance of ratiometric sensor 110 between ratiometric sensor output line 113 and a second reference voltage line 111.

First reference voltage line 112 is connected to the source of a first reference voltage, typically an approximately constant voltage ground (henceforth voltage "Vg"), while second reference voltage line 111 is connected to the source of a second reference voltage, typically an approximately constant power supply voltage Vcc, so that ratiometric voltage Vr=(Vcc−Vg)*R1/(R1+R2).

One advantage of ratiometric sensor 110 is the range of the ratiometric voltage Vr between the first reference voltage and the second reference voltage, as compared to the small sensitivity and drive of the photodiode current generated in a conventional circuit. The "rail-to-rail" range of ratiometric voltage Vr can vary for example from zero volts or Vg, if Vg≠0, when resistance R1=0 (i.e. fully conductive due to full light) to approximately Vcc volts when resistance R1 is infinite (i.e. non-conductive due to no light). First and second reference voltages can be any fixed predetermined voltages, such as 3 volts, 5 volts, 12 volts and 15 volts, as long as the first and second voltages are different from each other.

Ratiometric sensor 110 can be coupled through a current amplifier such as voltage controlled current amplifier 120 to any current driven electrically controllable device, such as a game machine (not shown), a personal computer 130 or an interactive television set top (not shown).

Figure 2A:
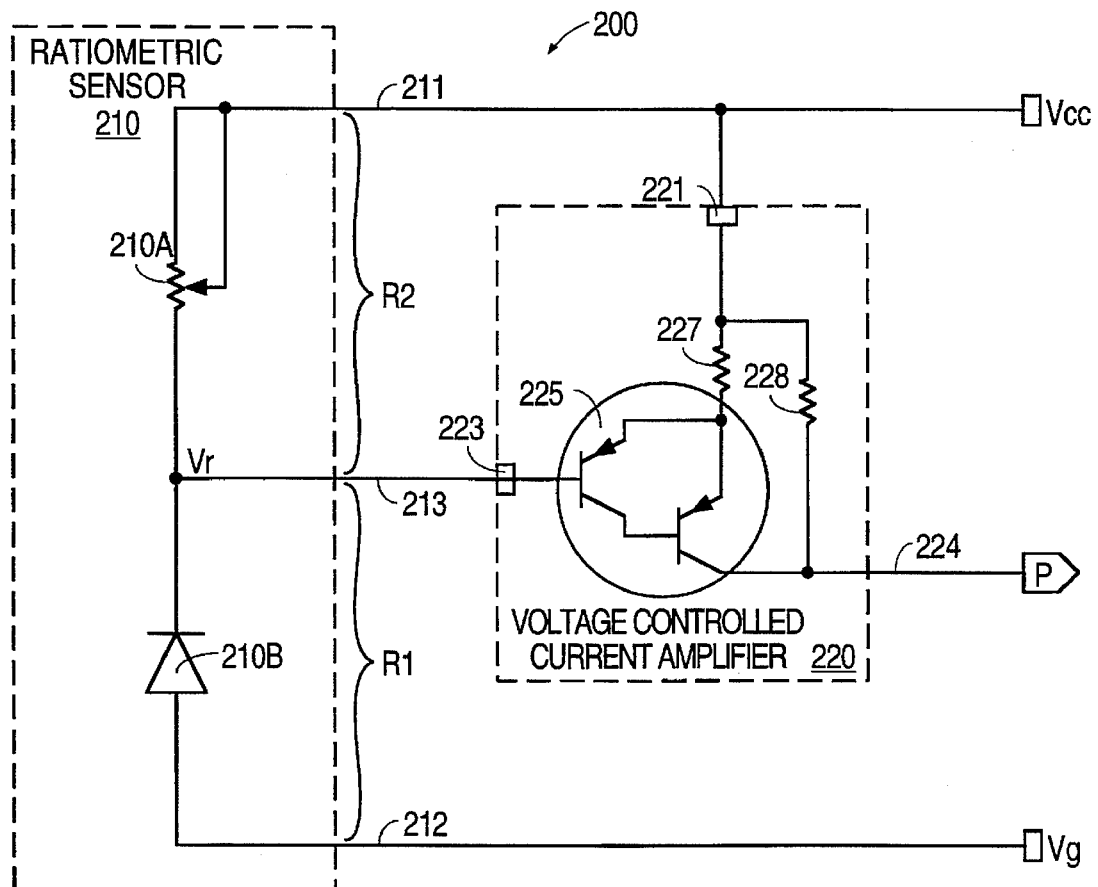

In one embodiment, a user can use a potentiometer 210A (FIG. 2A) included in ratiometric sensor 210 to vary the second equivalent resistance R2, and thereby set a ratiometric voltage Vr to typically (Vcc-0.3 volt) for example to indicate to a personal computer 130 that a movable element of a position sensing controller is in a neutral position. Ratiometric sensor 210 includes a ratiometric sensor output line 213 that is connected at one end to a junction between potentiometer 210A and a photodiode 210B and at another end to a high impedance input terminal 223 of voltage controlled current amplifier 220. Voltage-controlled current amplifier 220 includes, in one embodiment, two pnp transistors connected in a Darlington configuration, that are henceforth called "Darlington pair" 225.

Figure 2B:
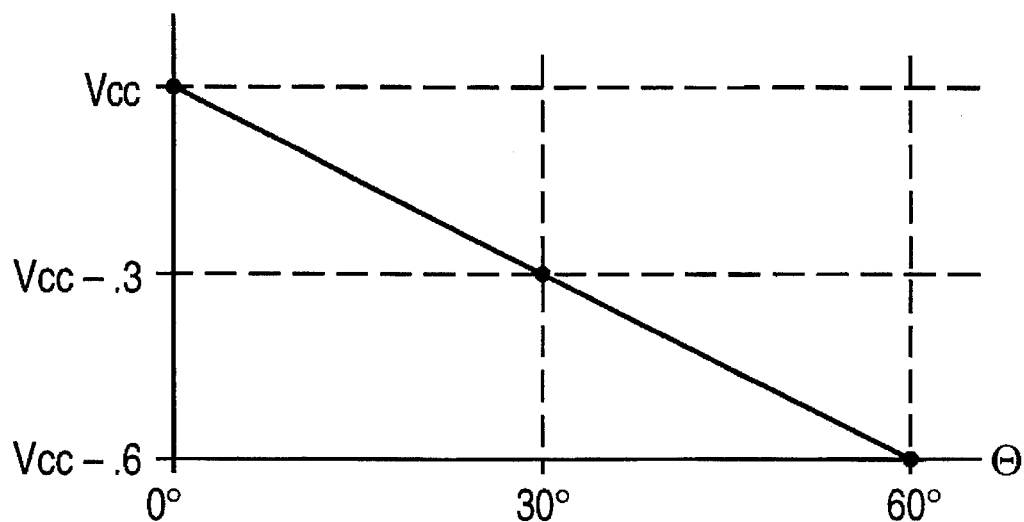
FIGS. 2B and 2C illustrate a ratiometric voltage and an amplified current for one embodiment of a ratiometric circuit of the type illustrated in FIG. 2A.

Ratiometric sensor 210 can supply voltage Vr between Vcc-0.6 volts and Vcc as illustrated by FIG. 2B for a position sensing controller. Various types of position sensing controllers that can use a ratiometric sensor are described in commonly owned, concurrently filed and copending U.S. patent application Ser. No. 08/359,307, incorporated by reference above.

Figure 2C:
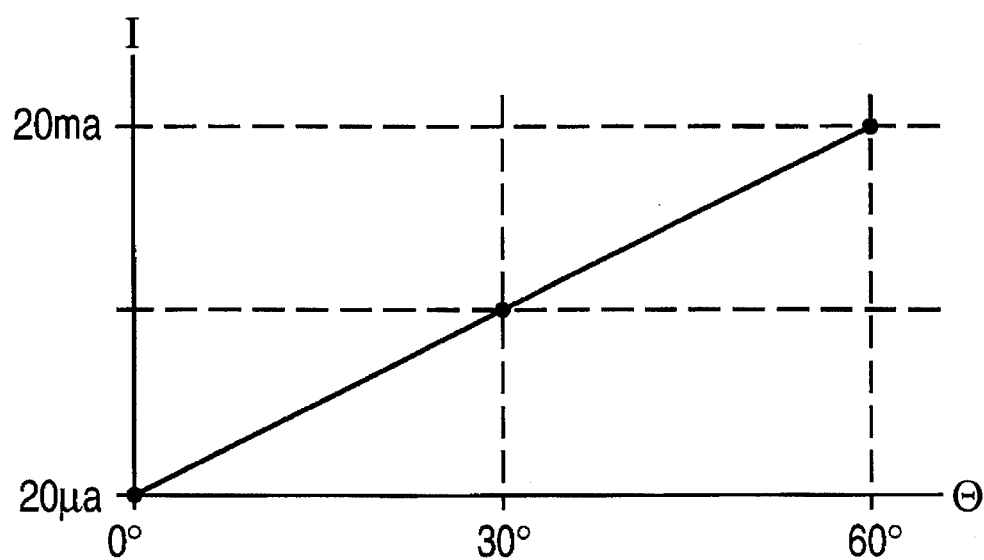

In response to the ratiometric voltage illustrated in FIG. 2B, Darlington pair 225 supplies a current as illustrated by FIG. 2C.

When the amount of light on and hence the current supplied by photodiode 210B increases, first equivalent resistance R1 decreases, which in turn decreases ratiometric voltage Vr. As the decreased ratiometric voltage Vr drives the base terminal of a transistor in a Darlington pair 225 (FIG. 2), the current supplied on current amplifier output line 224 increases, as compared to a neutral current. A similar but opposite effect occurs when the current supplied by photodiode 210B decreases.

A resistor 227 between power input terminal 221 and the emitter terminals of the transistors in the Darlington pair 225 limits the maximum current that is supplied at current amplifier output line 224. Another resistor 228 between power input terminal 221 and the collector of the Darlington pair's output transistor passes a small current (20 µAmps for resistance of 100 KΩ for resistor R228 in one embodiment) to current amplifier output line 224 when Darlington transistor 225 is off.

To summarize, voltage controlled current amplifier 220 amplifies (1000 times in one embodiment) changes in a voltage on input terminal 223 that is connected to ratiometric sensor output line 213, and in response to the voltage changes drives a current signal on current amplifier output line 224 that can be connected to a current-controlled analog-to-digital converter, such as current-controlled oscillator 136 (FIG. 1) for example, inside a game port 135 of a personal computer 130. Voltage-controlled current amplifier 220 draws power from a power input terminal 221 that is connected to the source of the second reference voltage in game port 135.

In one embodiment, a photodiode 312 (FIG. 3), in a ratiometric sensor 300 which includes resistor 330 and variable resistor 320, is reversed biased, with the anode connected to second first reference voltage line 318 and the cathode connected to ratiometric sensor output line 313. In an alternative embodiment, any other signal sensor of any complexity, such as a temperature, sensor, a pressure sensor or an acoustic sensor can be used, in conjunction with a corresponding signal source of the same type, such as a heater, air compressor and a speaker respectively, depending on the application.

Ratiometric sensor 300 (FIG. 3) is similar in most respects to ratiometric sensor 210 (FIG. 2A) except that ratiometric sensor 300 includes a light emitting diode (LED) 311 that supplies the light incident on photodiode 312 and a current limiting resistor 310 that limits the current drawn by and hence the amount of light generated by LED 311.

Any number of ratiometric sensors, such as ratiometric sensor 350 (FIG. 3) can be coupled in parallel with ratiometric sensor 300 between first reference voltage line 319 and second reference voltage line 318, for example to measure in a corresponding number of axes, the position of a movable element of a position sensing controller.

Figure 6:
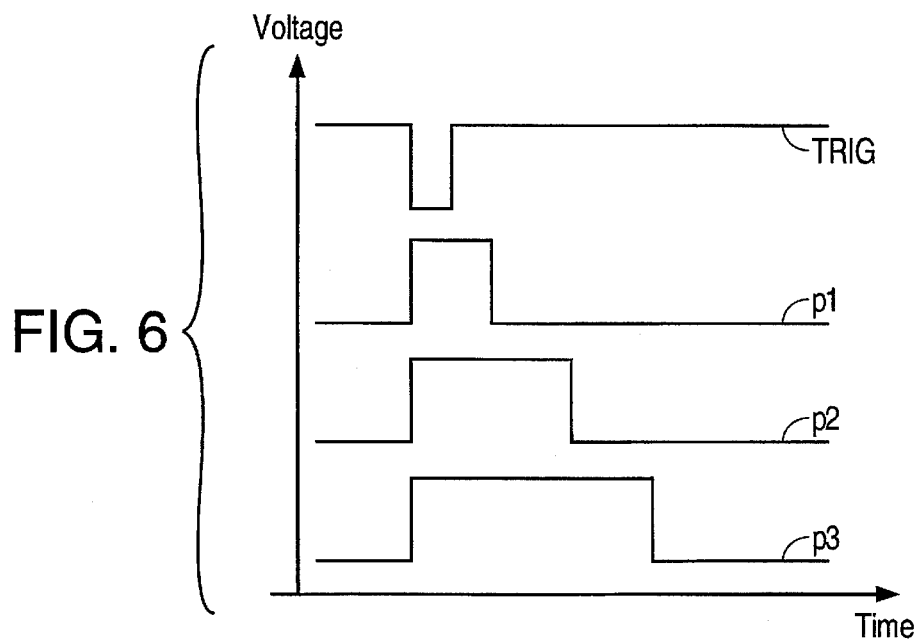
FIG. 6 illustrates a trigger signal TRIG and three pulse width modulated signals P1, P2 or P3 that can be output by the 555 timer of FIG. 5.

The current signals, on current amplifier output lines 324X and 324Y connected to the collectors of Darlington pairs 325 and 375, respectively, can drive analog input terminals 13 and 11 of a personal computer 330's game port 335 that conforms to the specification defined in "PC XT Technical Reference Manual", 1981 available from IBM Corporation, Boca Raton, Fla. In such an embodiment, an analog-to-digital converter, implemented by a current-controlled oscillator (for example, a 558 timer included in game port 335) uses the current signals to supply corresponding pulse width modulated signals Px and Py, in response to an active (e.g. low) trigger signal TRIG from a microprocessor, in the manner described below in reference to FIG. 6. The pulse width modulated signals can be timed by a microprocessor to convert the pulses into digital values that can be then manipulated by the microprocessor.

Figure 3:
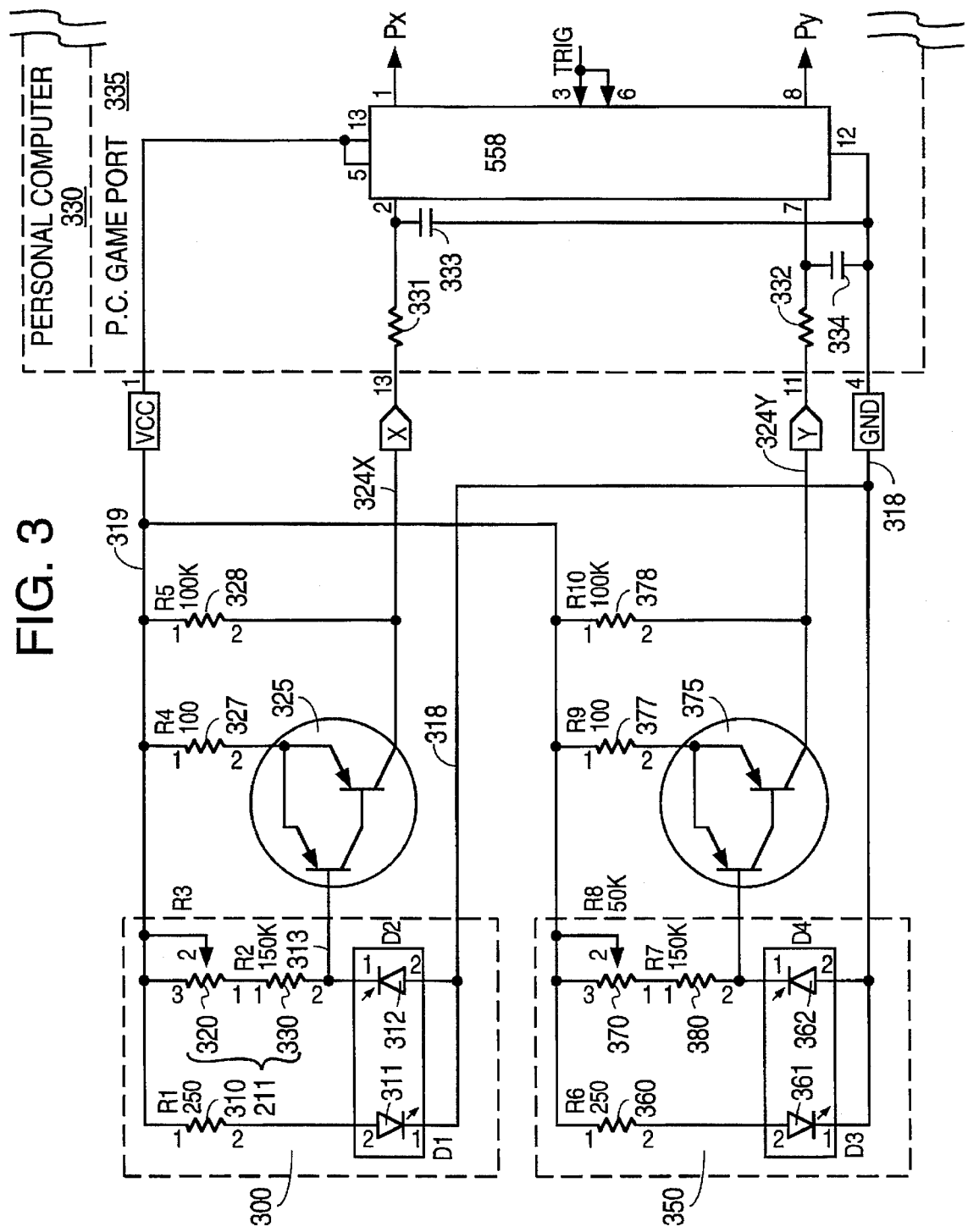
FIG. 3 illustrates a schematic diagram in one embodiment of the ratiometric circuit illustrated in FIG. 2A.

In one specific embodiment of the type illustrated in FIG. 3, the ratings for various components are listed in Table 1:

TABLE 1

| Component | Rating |
| --- | --- |
| Resistors 310, 360 | 250 Ω |
| LEDs 311, 361 | SFH42ON SIEMENS |
| Resistors 320,370 | 50K Ω Potentiometer |
| Resistors 330, 380 | 150K Ω |
| Photodiodes 312, 362 | BPW 34S SIEMENS |
| Resistors 327, 377 | 100 Ω |
| Transistors 325, 375 | MPSA64 Darlington |
| Resistors 328, 378 | 100 K Ω |
| Resistor 331, 332 | 2.2 K Ω |
| Capacitors 333, 334 | 0.01 µf |

An LED can have a power supply independent of the photodiode power supply, as long as the signal from the LED has a sufficient intensity to be received by the photodiode.

Figure 4:
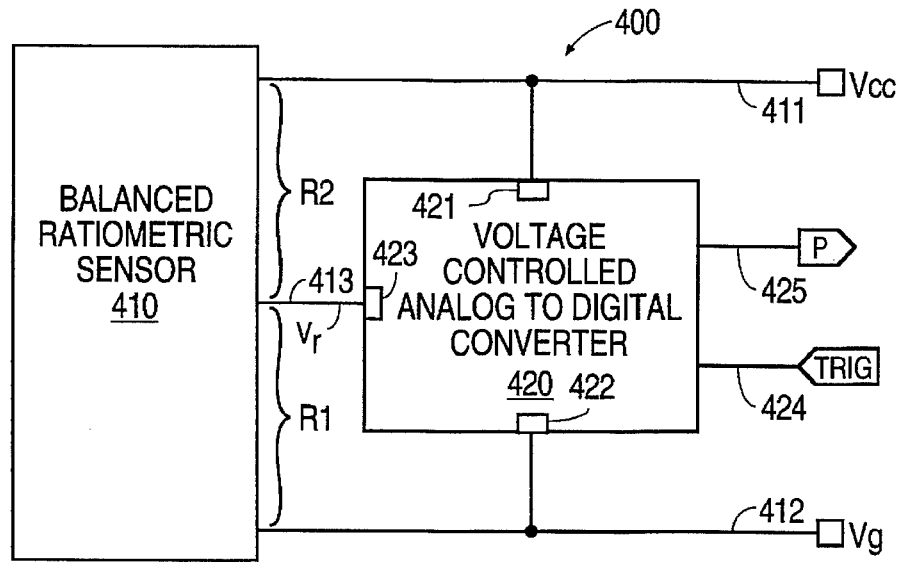
FIGS. 4 and 5 illustrate high and low level block diagrams of a "balanced" ratiometric circuit.

Ratiometric sensor 410 (FIG. 4) is similar to ratiometric sensor 110, except that ratiometric sensor 410 converts current signals from a first photodiode 501 (FIG. 5) of equivalent resistance R1 and a second photodiode 502 of equivalent resistance R2 into a ratiometric signal on ratiometric sensor output line 413. Any noise that affects both photodiodes 501 and 502 equally (for example if the amount of light increases by 10% thereby decreasing both equivalent resistances R1 and R2 to 90% of their original (neutral) values i.e. 0.9R1 and 0.9R2), the ratio R1/(R2+R1) remains unchanged, because scaling factor 0.9 gets canceled from the numerator and the denominator of the ratio. Such a low sensitivity to noise e.g. caused by power supply variations allows the ratiometric signal to be sampled with any predetermined degree of precision, depending on the needs of an application and eliminates costly filters, shields and voltage regulators that are used in conventional photodiode circuits.

The ratiometric voltage Vr on ratiometric sensor output line 413 can drive a high impedance input terminal of a voltage controlled analog-to-digital converter 420 (FIG. 4) that responds to an active (e.g. low) trigger signal TRIG on trigger input line 424 by supplying a pulse width modulated signal P on output line 425. The width of a pulse of signal P is proportion to the ratiometric voltage Vr on line 413.

In one embodiment, voltage controlled analog-to-digital converter 420 includes a monostable multivibrator in the form of a "555" timer 510, such as "TLC555" that is available from Texas Instruments, Inc. P.O. Box 809066, Dallas Tex. In an alternative embodiment, voltage controlled analog-to-digital converter 420 can be implemented with a "555" timer configured as an astable multivibrator. The configuration and operation of a 555 timer as a monostable multivibrator are described in, for example, pages 690 to 692 of "Microelectronics" by J. Millman and A. Grabel, Second Edition, published in 1987 by McGraw-Hill, Inc. that is incorporated herein in its entirety.

A ratiometric signal from ratiometric sensor 410 (FIG. 5) can drive a control input pin (typically pin 5, also referred to as "threshold" pin) of "555" timer 510, which control input pin is coupled to a resistive voltage divider (not shown) inside "555" timer 510. In response to an active (e.g. low) trigger signal TRIG (FIG. 6) on a trigger input pin (typically pin 2), "555" timer 510 (FIG. 5) drives a pulse width modulated signal P, such as one of signals P1, P2 or P3 (FIG. 6), high on an output pin (typically pin 3).

The width of a pulse of signal P is determined by the period of time required by a timing capacitor 503 (FIG. 5) to charge from ratiometric voltage Vr to a maximum voltage Vm=2 Vcc/3 in one embodiment, as required by a threshold input terminal of a "555" timer. Timing capacitor 503 charges toward second reference voltage Vcc with a "555" timer's time constant $\tau=1.1RC$ in one embodiment, where C is the capacitance of timing capacitor 503 and R is the resistance of resistor 504.

In one specific embodiment, "555" timer 510 generates pulse width modulated signals P1, P2 or P3 (FIG. 6) when ratiometric voltage Vr is 2Vcc/3, Vcc/2 or Vcc/3 respectively, when R=47K ohms and C=0.1 microfarads.

Pulse width modulated signal P from "555" timer 510 is independent of second reference voltage Vcc, because "555" timer 510 compares ratiometric voltage Vr=Vcc * R1/(R1+ R2) with maximum voltage $$Vm=Vcc * \tfrac{2}{3}$$

so that the common scaling factor of Vcc has no effect on the width of a pulse in signal P.

Supplying a ratiometric signal to a monostable multivibrator provides a pulse width modulated signal P that can be sensed by a microprocessor and yet has excellent noise immunity, because of insensitivity to voltage fluctuations. Combination of a ratiometric sensor with a monostable multivibrator eliminates a voltage regulator or a large filter capacitor, that were otherwise required in prior art photodiode circuits.

Figure 5:
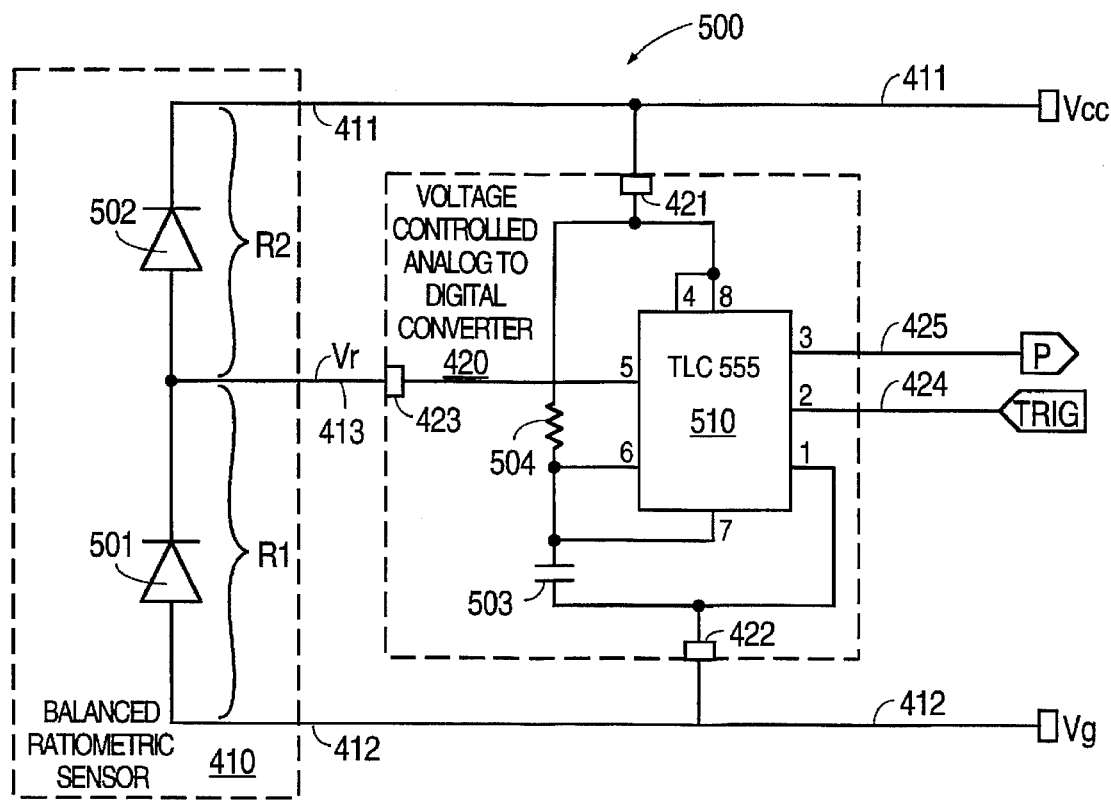

FIGS. 7A to 7H illustrate alternative embodiments of ratiometric sensors of the type illustrated in FIG. 5.

Ratiometric sensor 710A (FIG. 7A) includes a LED 721A in series with a current limiting resistor 718A that are connected in parallel with photodiodes 715A and 716A, between sources of voltages Vcc and Photodiodes 715A and 716A have varying resistances, depending upon the amount of light incident on the photodiodes, so that ratiometric voltage Vr on ratiometric sensor output line 713A is proportional to the ratio A2/(A1+ A2) where A1 and A2 are the amounts of light incident on photodiodes 715A and 716A respectively. The amount of incident light can be changed by an optical gate in a position sensing controller of the type described in U.S. patent application Ser. No. 08/359,309, that is incorporated by reference above.

Also as described above in reference to FIG. 3, instead of a photodiode, other signal sensors, for example, a temperature sensor, a pressure sensor or an acoustic sensor can be used in the ratiometric sensors of FIGS. 7A to 7H. Photodiodes are preferred for position sensing controllers of the type described in U.S. patent application Ser. No. 08/359, 307, because photodiodes are inexpensive, compact, fast, have a linear response, have a very wide dynamic range and have no moving parts, as compared to other signal sensors.

Figure 7A:
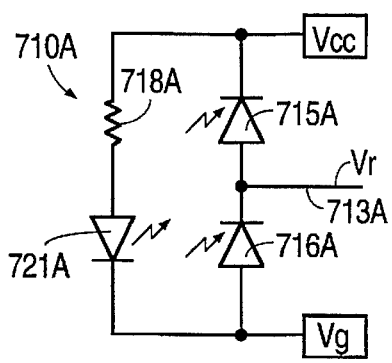
FIGS. 7A to 7H illustrate various embodiments of a ratiometric sensor of the type illustrated in FIG. 5.
Figure 7B:
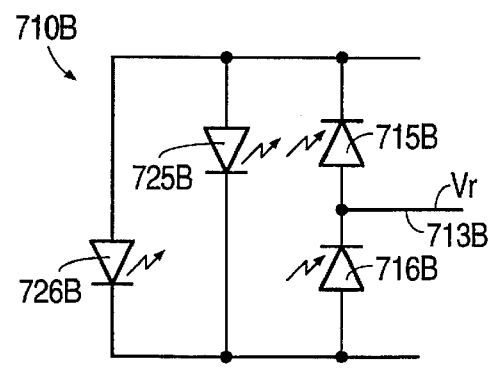

Although the embodiment of FIG. 7A illustrates two identical photodiodes, such as photodiodes 715A and 716A, two different types of photodiodes can be used, so long as the signal on ratiometric sensor output line 713A is appropriately calibrated, for example by a potentiometer or by software in a microcontroller that is driven by the ratiometric signal.

Although in FIG. 7A, ratiometric sensor 710A is illustrated as having a single LED 721A, any number of signal sources can be used. For example, in FIG. 7B, two LEDs 725B and 726B are used, each in conjunction with one of photodiodes 715B and 716B. LEDs 725B and 726B are independent of each other and can be separated by a physical barrier and yet provide the same functionality as a single LED 721A (FIG. 7A). Independent LEDs allow electrical trimming (i.e. adjustment of resistors that are connected in series with the LEDs) to compensate for any asymmetry in light output from two opposite LEDs, for example in the neutral position of a handle, when a gate is centered between the LEDs.

Ratiometric sensor 710B can generate a voltage that varies inversely and approximately linearly (illustrated in FIG. 8 for various embodiments) with the position of a movable element, when ratiometric sensor 710B is used in a position sensing controller of the type described in U.S. patent application Ser. No. 08/359,307, referenced above. In one embodiment, ratiometric voltage Vr follows curve B1 (FIG. 8) when a handle in a position sensing controller is tilted from one extreme position, for example θ=0° to the other extreme position, for example θ=θm (in one embodiment θm=60°). For curve B1, the distance d between a LED and a photodiode is 0.95 inch and resistance of the current limiting resistor is 2K ohms.

In another embodiment, for the same distance d, a current limiting resistor of 1K ohms results in curve B2 that has a greater dynamic range than curve B1 because the entire range of voltage from Vr=5 volts to Vr=0 volt is generated when a handle is moved from θ=0° to θm (of 60°). In yet another embodiment, a current limiting resistor of 500 ohms results in curve B3 that has more sensitivity than curve B2 and hence is useful for example when a handle can move less than a total maximum angle θm of 30°. In other embodiments, a current limiting resistor of 1K ohm results in similar curves B4 and B5 for distance d of 1.15 inch and 1.65 inch respectively.

Figure 8:
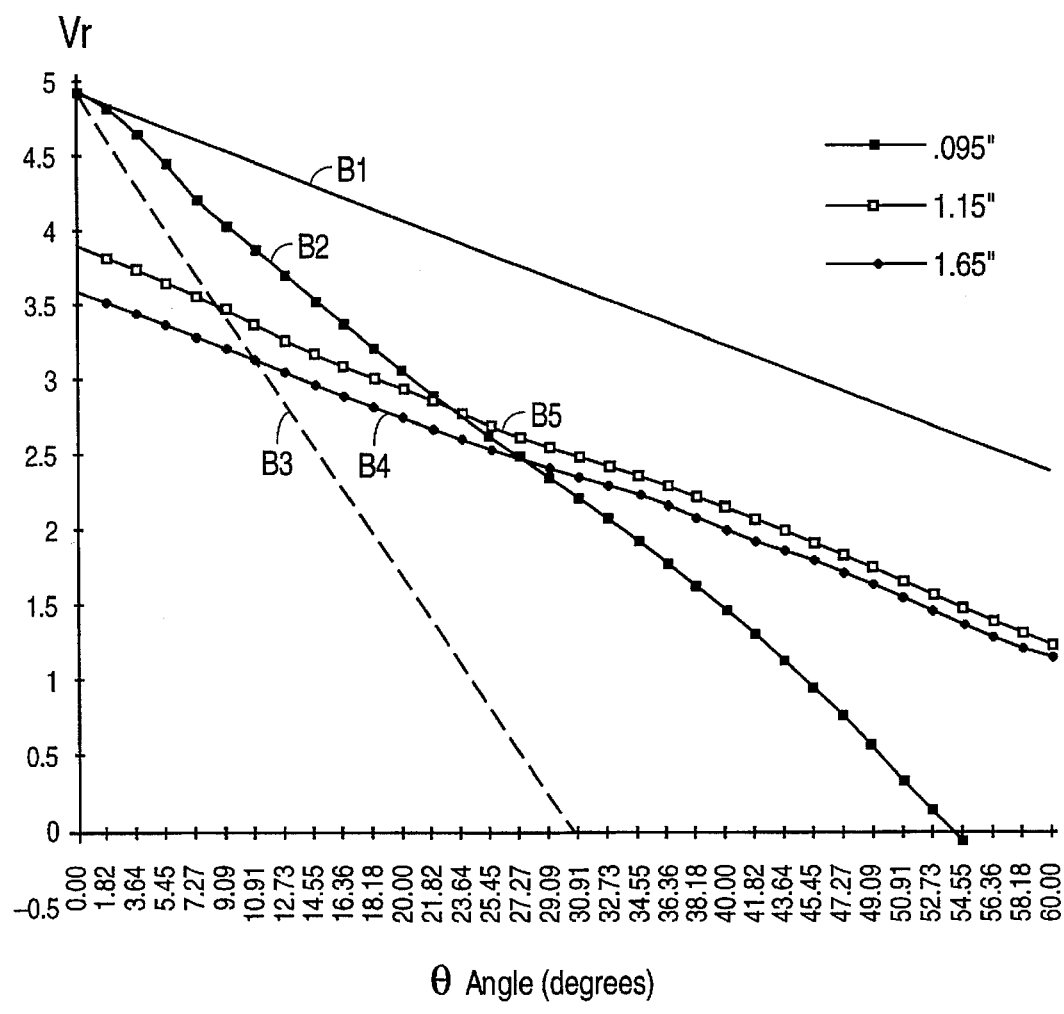
FIG. 8 illustrates an inverse linear relationship between the ratiometric voltage generated by a ratiometric circuit of the type illustrated in FIG. 4 and, for example, the tilt angle of a tilt adjuster of a position sensing controller.

The values for FIG. 8 are listed in Table 1 below:

TABLE 1

| TILT | 0.95" | 1.15" | 1.65" |
| --- | --- | --- | --- |
| 0.00 | 4.9 | 3.91 | 3.59 |
| 1.82 | 4.8 | 3.83 | 3.54 |
| 3.64 | 4.7 | 3.76 | 3.45 |
| 5.45 | 4.5 | 3.66 | 3.37 |
| 7.27 | 4.2 | 3.57 | 3.28 |
| 9.09 | 4 | 3.47 | 3.22 |
| 10.91 | 3.9 | 3.36 | 3.14 |
| 12.73 | 3.7 | 3.26 | 3.06 |
| 14.55 | 3.5 | 3.18 | 2.97 |
| 16.36 | 3.4 | 3.08 | 2.90 |
| 18.18 | 3.2 | 3.01 | 2.83 |
| 20.00 | 3.1 | 2.94 | 2.76 |
| 21.82 | 2.9 | 2.86 | 2.67 |

TABLE 1-continued

| TILT | 0.95" | 1.15" | 1.65" |
| --- | --- | --- | --- |
| 23.64 | 2.8 | 2.77 | 2.61 |
| 25.45 | 2.6 | 2.69 | 2.54 |
| 27.27 | 2.5 | 2.61 | 2.47 |
| 29.09 | 2.3 | 2.56 | 2.40 |
| 30.91 | 2.2 | 2.48 | 2.34 |
| 32.73 | 2.1 | 2.42 | 2.28 |
| 34.55 | 1.9 | 2.36 | 2.23 |
| 36.36 | 1.8 | 2.30 | 2.14 |
| 38.18 | 1.6 | 2.21 | 2.08 |
| 40.00 | 1.5 | 2.15 | 2.00 |
| 41.82 | 1.3 | 2.08 | 1.93 |
| 43.64 | 1.1 | 2.01 | 1.87 |
| 45.45 | 1 | 1.92 | 1.81 |
| 47.27 | 0.8 | 1.84 | 1.72 |
| 49.09 | 0.6 | 1.76 | 1.65 |
| 50.91 | 0.4 | 1.68 | 1.55 |
| 52.73 | 0.2 | 1.58 | 1.49 |
| 54.55 | −0.1 | 1.50 | 1.38 |
| 56.36 | | 1.41 | 1.31 |
| 58.18 | | 1.33 | 1.23 |
| 60.00 | | 1.25 | 1.18 |

Figure 7C:
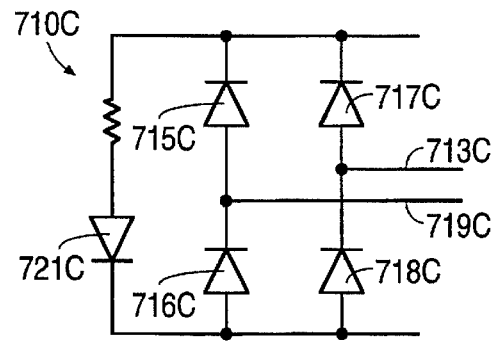

A number of pairs of photodiodes can be used when more than one parameter is to be determined, for example a joystick handle's position in two dimensions along X and Y axes. FIG. 7C illustrates two pairs of photodiodes, pair (715C and 716C) connected to ratiometric sensor output line 719C and pair (717C and 718C) connected to ratiometric sensor output line 713C respectively. A single LED 721C generates the light incident on pair (715C and 716C) and also on pair (717C and 718C) that supply the voltages on ratiometric sensor output lines 719C and 713C. Ratiometric sensor 710C (FIG.7C) has the advantage of not requiring multiplexing control lines from a central processing unit, such as lines EA_CC and EB_CC (FIG. 7D) described below.

Figure 7D:
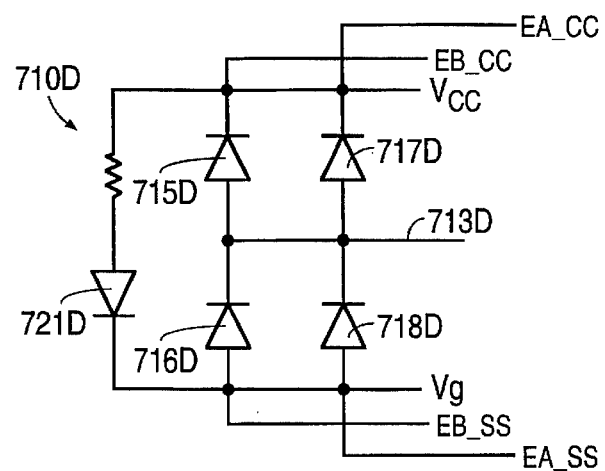

FIG. 7D illustrates another embodiment of ratiometric sensor 710D that includes a LED 721D connected between sources of voltages Vcc and Vg and a first photodiode pair (715D and 716D) connected between a first voltage enable line EB_CC and a second voltage enable line EB_SS. Ratiometric sensor 710D also includes another photodiode pair (717D and 718D) connected between a third voltage enable line EA_CC and a fourth voltage enable line EA_SS.

First voltage enable line EB_CC and second voltage enable line EB_SS can be momentarily (for example for one millisecond) connected respectively to sources of voltages Vcc and Vg and the voltage on ratiometric sensor output line 713D can be measured to determine the amount of light incident on photodiodes 715D and 716D. Then at a later point of time, first voltage enable line EB_CC and second voltage enable line EB_SS are switched to a high impedance input terminal and third voltage enable line $EA_{13}$ CC and fourth voltage enable line EA_SS are momentarily connected to sources of voltages Vcc and Vg respectively, to determine the amount of light incident on photodiodes 717D and 718D, on the same ratiometric sensor output line 713D. Ratiometric sensor 710D has the advantage of using a single signal source for multiple signal sensors, for example with a spherically shaped optical gate, such as optical gate 114 illustrated in FIGS. 1B and 1C of U.S. patent application Ser. No. 08/359,309 incorporated by reference above, for detecting movement of a lever along two axes.

A ratiometric sensor 710E (FIG. 7E) can include multiple LEDs, such as LEDs 721E and 722E that are independently switched on to measure the amount of light incident on corresponding photodiode pair (714E, 715E) and photodiode pair (716E and 719E) respectively. The ratiometric signal generated by photodiodes 714E and 715E can be measured by turning on only LED 721E by driving the signal on line EA__SS active (e.g. high) and the signal on line EB__SS inactive (e.g. low). Similarly, the ratiometric signal generated by photodiodes 716E and 719E can be measured by turning on only LED 722E by driving the signal on line EB__CC active (e.g. high) and on line EA-CC (e.g. low).

Figure 7E:
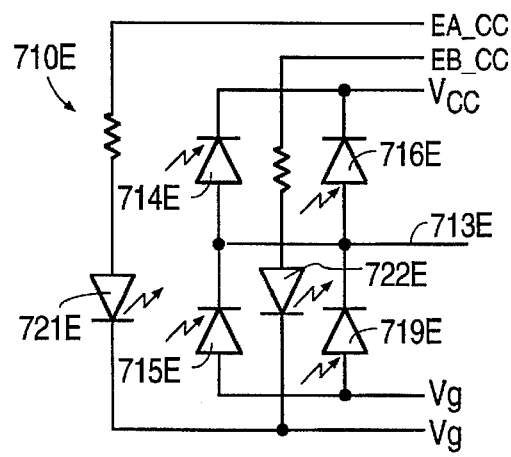
Figure 7F:
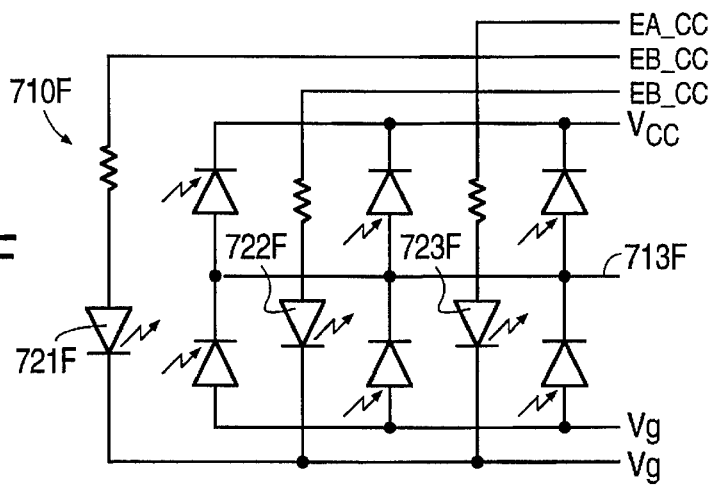
Figure 7G:
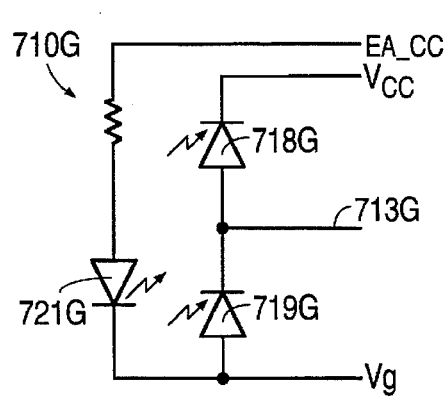

One advantage of ratiometric sensor 710E as compared to ratiometric sensor 710D is that on line EA__CC and EB__CC (FIG. 7E) only two control signals are needed for two axes when LEDs 721E and 722E are multiplexed. Although FIG. 7E illustrates a ratiometric sensor 710E that has two LEDs and two pairs of photodiodes, any number of LEDs and photodiodes can be used. For example, FIG. 7F illustrates three LEDs and three pairs of photodiodes in one embodiment of a ratiometric sensor 710F for a three-dimensional controller.

Also, a line that supplies power to a LED, such as line EA__CC (FIG. 7G) can be connected to a source of voltage Vcc to turn on LED 721G only when the amount of light incident on photodiodes 718G and 719G is being measured, from the voltage in ratiometric sensor output line 713G. One advantage of ratiometric sensor 710G is that LED 721G can be kept turned off when not in use and thereby save power from, for example, a battery.

Figure 10:
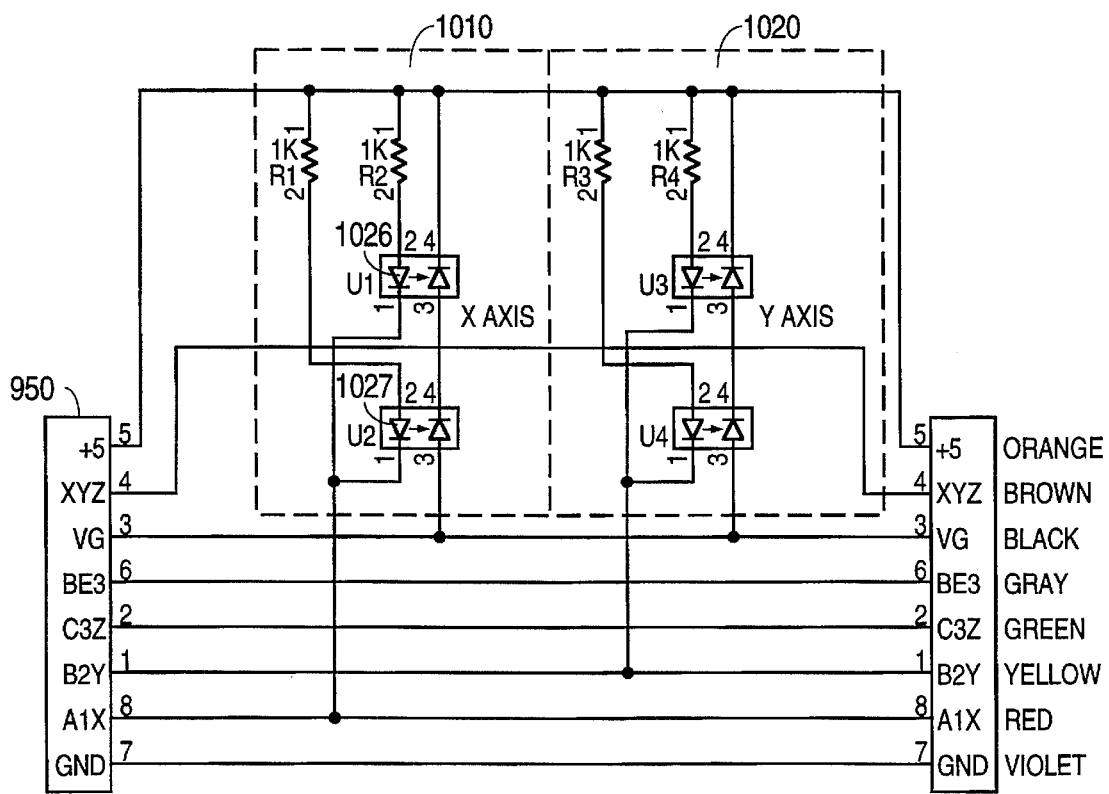

Ratiometric sensor 710H is similar to ratiometric sensor 710G except that instead of a single LED, two LEDs are used for each of axes X and Y. One advantage of ratiometric sensor 710H is that a single resistor 718H can be used for all LEDs and thereby reduce cost, complexity and space as compared to for example ratiometric sensors 1010 and 1020 (FIG. 10). Also in all ratiometric sensors 710A to 710H described above, all electronics can be mounted flat, on a single printed circuit board, as compared to prior art circuits used in conventional joysticks.

Figure 7H:
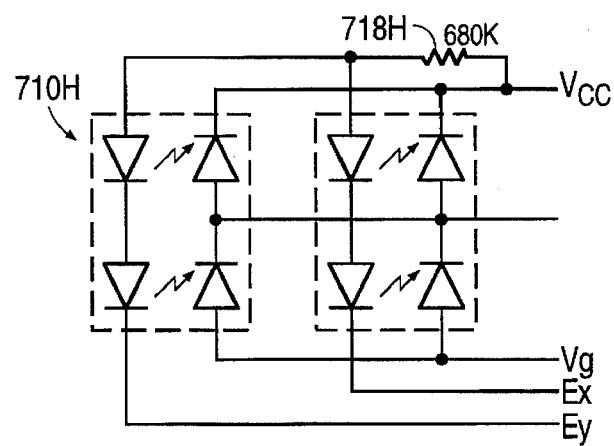

A three-dimensional joystick can include three ratiometric sensors 910 (FIG. 9), 1010 and 1020 (FIG. 10). The electronic components in ratiometric sensors 910, 1010 and 1020 are similar or identical to, and have functions similar or identical to ratiometric sensor 710H (FIG. 7H). In addition, circuit 900 includes buttons A, B and C and diodes D1, D2 and D3 that are described below. Also, resistors R1 and R2 (FIG. 9) limit the current through LEDs in packages U1 and U2 while capacitor C1 (FIG. 9) filters out spikes in the voltage supply. Ratiometric sensors 910, 1010 and 1020 are coupled by connectors 950, 1050 and a "556" timer 1101 (FIG. 11) to a microprocessor 1110.

As is well known, a 556 timer, such as TLC556 available from Texas Instruments, Inc., includes two 555 timers in a single package for economy in size and cost.

Microprocessor 1110 implements a computer process 1200 (FIG. 12) that samples the X, Y and Z axes ratiometric signals as well as the status of various buttons. The computer source code for one embodiment of a computer process 1200 that is listed in Microfiche Appendix A, can be assembled using the M68HC05P9 assembler and run on a microprocessor MC68HC05P1, both of which are available from Motorola, Inc. of Phoenix, Ariz. Use of microprocessor M68HC05P1 is less expensive than the use of the majority of currently available microprocessors.

Using process 1200 (FIG. 12), microcontroller 1110 (FIG. 11) measures the output of ratiometric sensors 910 (FIG. 9), 1010 and 1020 (FIG. 10) by alternately connecting each of pins C3Z (FIG. 11), B2Y and A1X to ground, to turn on one of the LEDs in ratiometric sensors 910, 1010 and 1020 (FIGS. 9 and 10), while holding the other two pins in a high impedance input state, so that the other two LEDs are kept turned off. Simultaneously, microprocessor 1110 (FIG. 11) also connects one of pins BEX, BEY or BEZ to ground, to measure the ratiometric signal from one of three other ratiometric sensors (not shown) that are coupled through connector 1150 and timer 1101 to microprocessor 1110.

Figure 16:
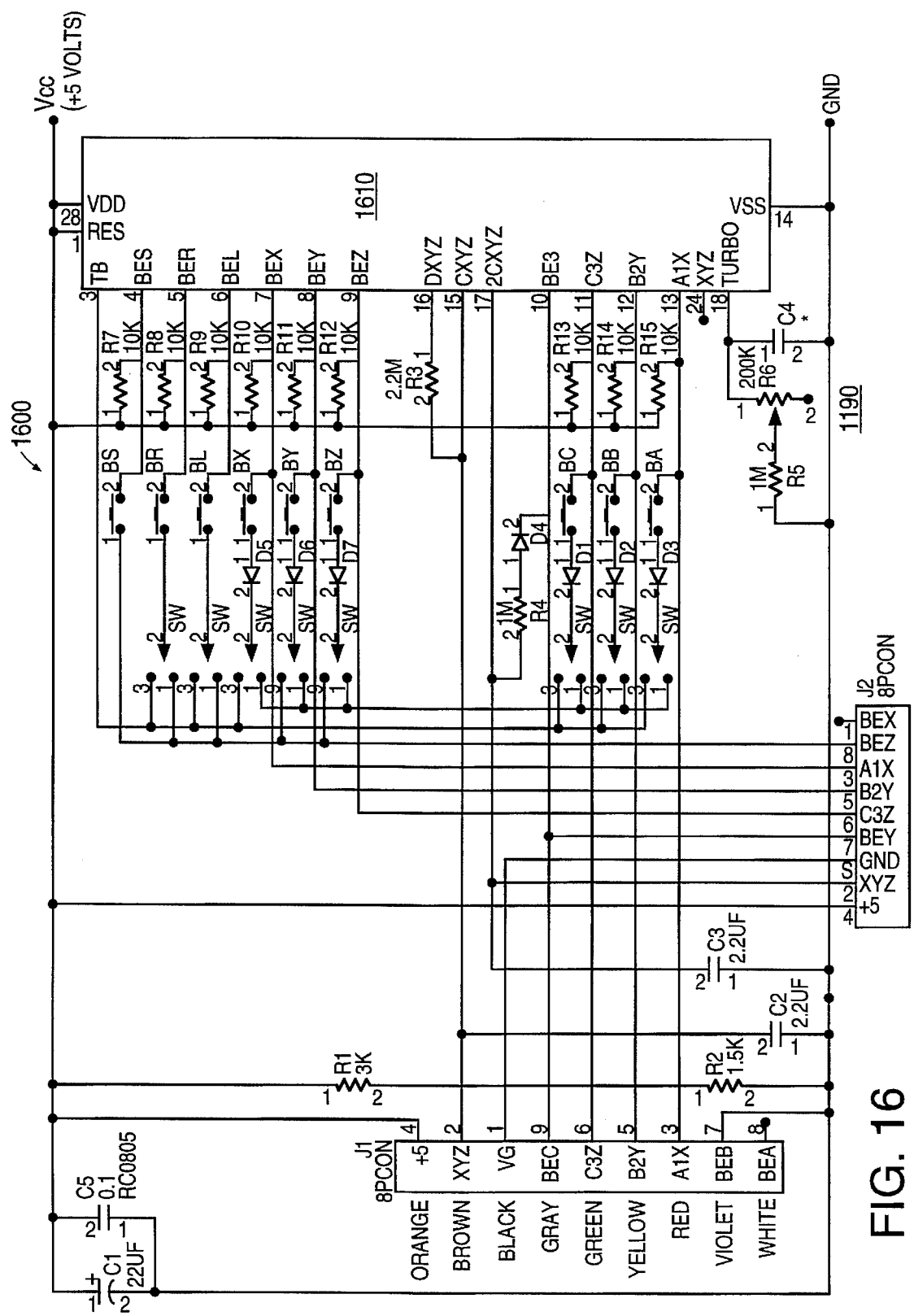
FIG. 16 illustrates a schematic circuit diagram of one embodiment of a ratiometric circuit of the type illustrated in FIG. 14.

Specifically, on startup in setup step 1210, process 1200 (Microfiche Appendix A at page 6) configures the input-output data directions of various pins, such as pins 3 to 13 (FIGS. 11 and 16) and 15 to 25 (Microfiche Appendix A at page 9). Microprocessor 1110 then initializes all memory locations to zero and checks for a second joystick (Microfiche Appendix A at page 10).

Then in autozero step 1220, process 1200 samples the ratiometric signals from each of the ratiometric sensors 910, 1010 and 1020 in the manner described above (for example in reference to FIG. 7E), by sensing the time period of a pulse at each of pins A1X, B2Y, C3Z, BEX, BEY and BEZ, for use as zero error caused by, for example, a movable element in a neutral position. Computer process 1200 implements the routine for autozero step 1220 multiple times (as often as necessary), while waiting for power (e.g. Vcc) to stabilize. Autozero step 1220 uses routines similar to "get__xyz1" and "get__xyz2" that are described below.

Next, in step 1230, process 1200 receives ratiometric sensor data (Microfiche Appendix A, page 17 in "main") generated by, for example, the position of a movable element in a position sensing controller during a video game. In step 1220, process 1200 senses the time period of the pulse from timer 1101 by driving a signal active on one of pins A1X, B2Y or C3Z using routine "get_xyz1." Subsequently process 1200 senses the time period of the pulse also from timer 1101 by driving a signal active at one of pins BEX, BEY and BEZ using the routine "get_xyz2".

Figure 11:
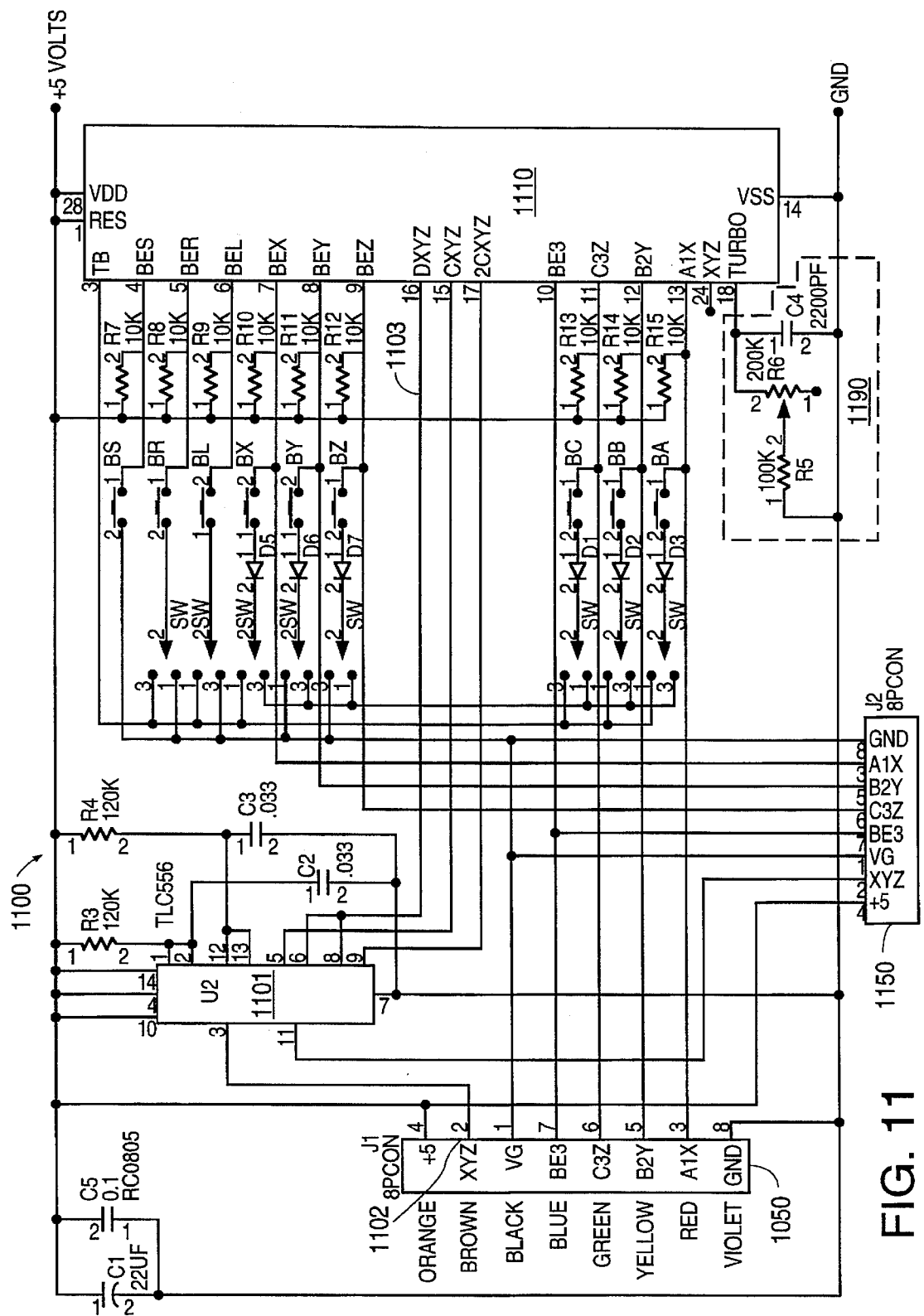
Figure 12:
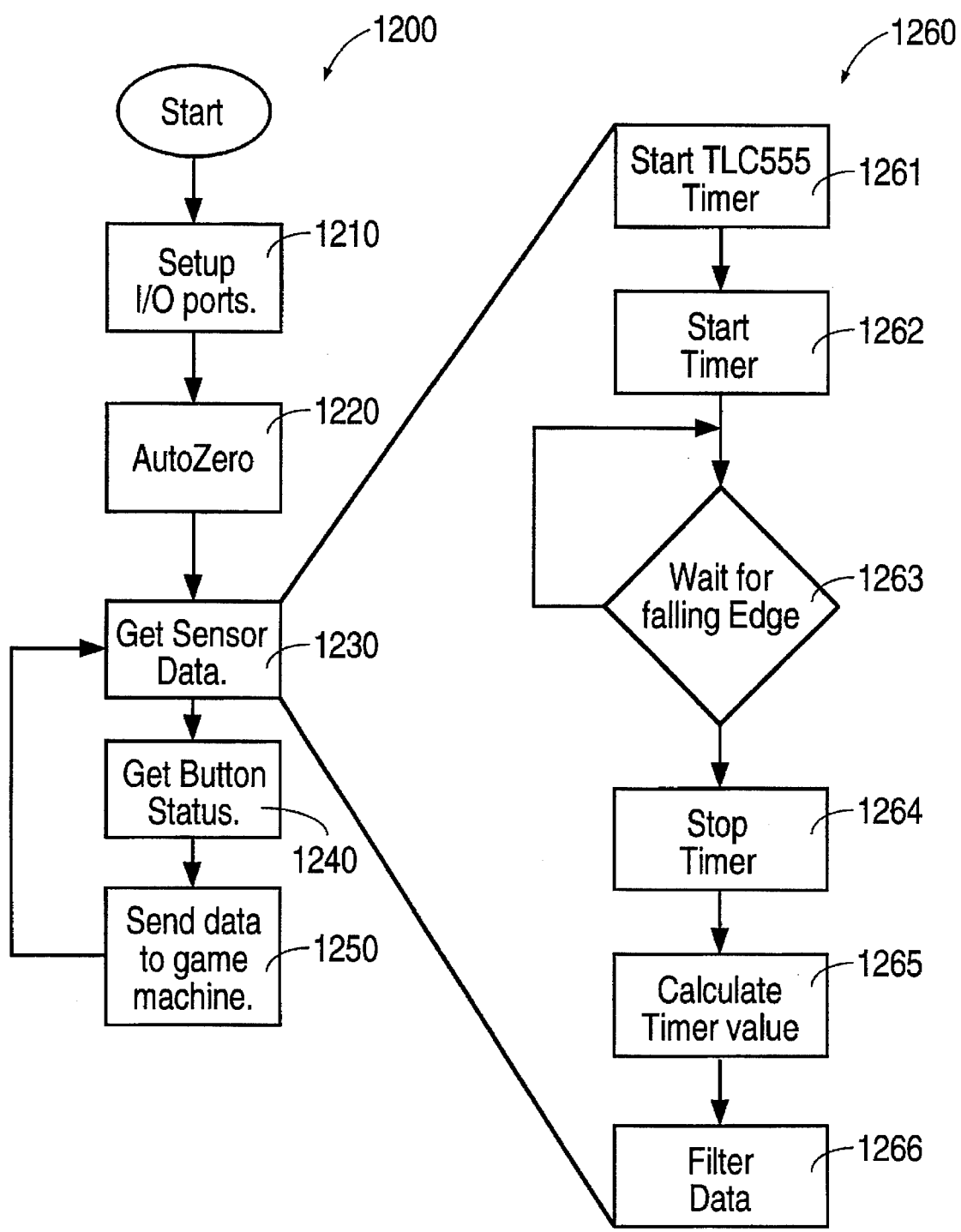
FIG. 12 illustrates a flow chart of the software that controls the microcontroller of FIG. 11.

Routines get_xyz1 and get_xyz2 (Microfiche Appendix A at pages 15 and 16) are similar to each other and are illustrated by subprocess 1260 in FIG. 12. Subprocess 1260 uses pin DXYZ to trigger both timers that are resident inside 556 timer 1101 (FIG. 11) by sending an active (e.g. low) pulse on line 1103 in step 1261, and then starts a local timer (not shown) in step 1262. Subprocess 1260 then waits in step 1263 for a falling edge in the signal being monitored on pin CXYZ or CXYZ2, depending on which of the pins A1X, B2Y, C3Z, BEX, BEY or BEZ was most recently driven by an active signal.

On sensing the falling edge, subprocess 1260 stops the local timer in step 1264, and calculates the time indicated by the local timer that corresponds to the pulse width, in step 1265. Then subprocess 1260 filters data in step 1266 (Microfiche Appendix A at page 13) which eliminates jitter by averaging four most recent values of the pulse width of the sampled signal. On completion of subprocess 1260 in step 1230, process 1200 gets the button status in step 1240.

The function of each of buttons BR, BS, BL, BX, BY, BZ, BA, BB and BC is identical and is explained below in reference to button BC. Button BC can be used in one of two modes: normal mode or turbo mode. In a normal mode, a button includes a momentary switch that remains closed while the user is pressing the button, until the user releases the button. In a turbo mode, the button automatically closes and opens a switch repeatedly while the user is pressing the button, until the user releases the button, after which time the switch remains open until the button is again pressed. The turbo mode can be used in a video game application to indicate, for example, the rapid firing of a machine gun.

In a normal mode, one terminal of button BC is connected to ground through pin BE3. When button BC is not pressed, pin C3Z is pulled up by resistor R13. When button BC is pressed, pin C3Z goes to ground through pin BE3.

Diodes D1 to D6 (FIG. 11) isolate one of pins C3Z, B2Y or A1X from another of these pins when more than one button is pressed simultaneously and one of the pins is at a logic zero while the other two pins are at logic one. This type of simultaneous pressing can happen for example during the sampling of ratiometric signals from circuits 1010 (FIG. 10) and 1110. For example, microprocessor 1110 (FIG. 11) turns on LEDs 1026, 1027 of circuit 1010 (FIG. 10) by connecting pin C3Z to ground. Microprocessor 1110 (FIG. 11) also uses pin C3Z to determine the state of button BC by driving a high signal on pin C3Z by making pin C3Z an input pin which automatically causes pin C3Z to be pulled up to voltage Vcc via resistor R13. When button BC is closed, pin C3Z is pulled down to ground by pin BE3 via diode D1.

Microcontroller 1110 also uses pin C3Z to turn on the power to LEDs 1026 and 1027 of circuit 1010 (FIG. 10) by driving pin C3Z to ground. Microprocessor 1110 maintains pins B2Y, A1X, BEX, BEY and BEZ at voltage Vcc while pin C3Z is connected to ground. If button BC is pressed simultaneously with one of the other buttons BB, BA, BX, BY or BZ, diode D1 prevents a direct path from being formed between pin C3Z and another pin, such as pin B2Y, A1X, BEX, BEY or BEZ. Such a direct path can result in turning on two or more of the other LEDs and thereby result in an incorrect ratiometric voltage on ratiometric voltage line 1202.

In the turbo mode, one of the terminals of button BC is connected to pin TB that carries a voltage which oscillates between ground and Vcc (e.g. 5 volts) at a rate determined by potentiometer R6 (explained below). So when button BC is pressed, the voltage on pin C3C oscillates along with the voltage on pin TB.

A turbo circuit 1190 connected to pin 18 drives the voltage on pin TB. Turbo circuit 1190 includes a capacitor C4 that is initialized to Vcc by pin 18 and is discharged through potentiometer R6 and resistor R5. Microprocessor 1110 measures the discharge time of capacitor C4 to a logic threshold of pin 18 by monitoring the change in state of the signal on pin 18 as the signal changes from a logic 1 to a logic 0. The rate of oscillation of turbo circuit 1190 is inversely proportional to the rate of discharge of capacitor C4, that is in turn proportional to the resistance of potentiometer R6.

Then process 1200 (FIG. 12) sends all of the received data to a game machine or another electrically controllable device in step 1250. The software code for implementing step 1250 depends on the specific game machine, such as a game machine that is available from, for example, Sega, Inc. 130 Shoreline Drive, Redwood City, Calif., Nintendo, Inc., 4820 150th Avenue, N.E. Redmond, Wash. or 3DO, Inc., 600 Galveston Drive, Redwood City, Calif. Such software code can control a personal computer using mouse signals that are defined by, for example, The Mouse Programmers Guide, available from Microsoft Corporation, One Microsoft Way, Redmond, Wash. Software code for step 1250 is within the skill of a person skilled in the art of programming microprocessors.

Figure 9:
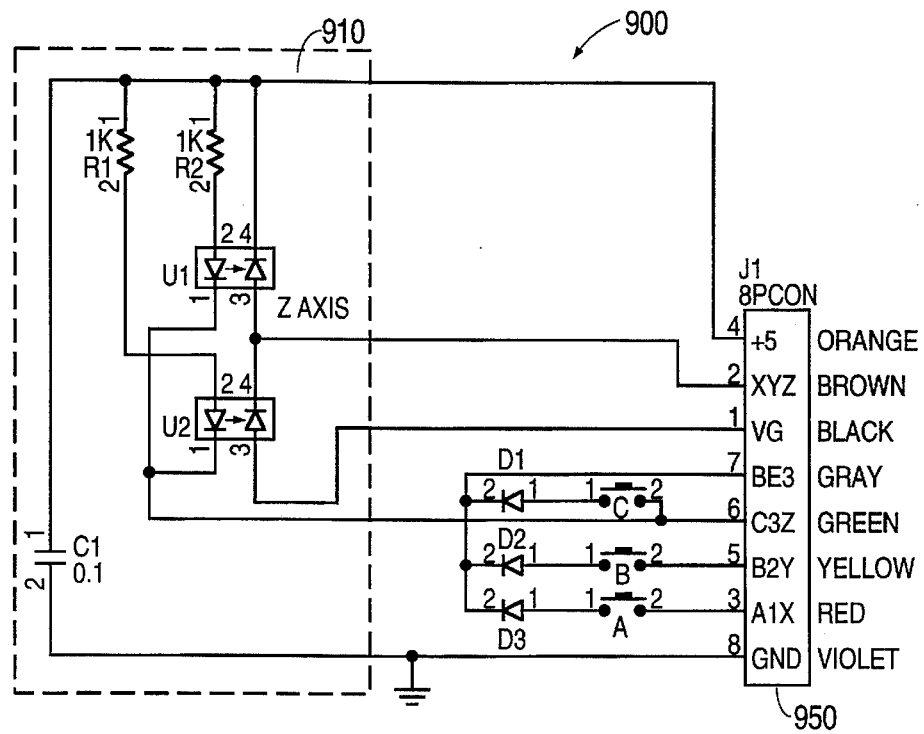
FIGS. 9, 10 and 11 illustrate a circuit that contains three ratiometric sensors.
Figure 13:
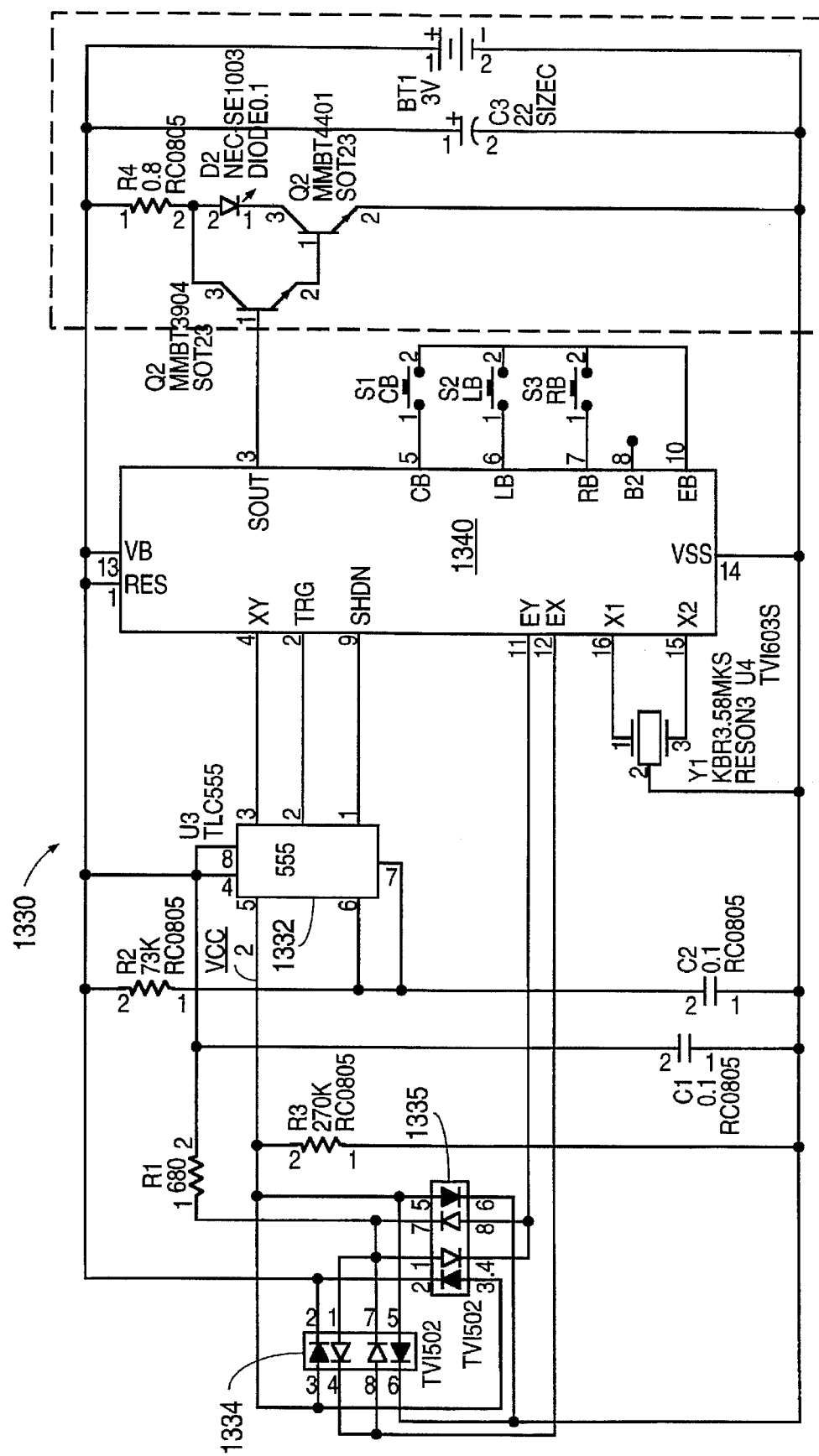
FIGS. 13 illustrates a balanced ratiometric sensor of the type illustrated in FIG. 5.

Position sensing circuit 1330 (FIG. 13) is similar to the position sensing circuit of FIGS. 9, 10 and 11, except that resistor R3 (FIG. 13) is used to bias a control input terminal (typically terminal 5) of "555" timer 1332 to voltage Vcc/2. In one embodiment, resistor R3 is 270K ohms.

Resistor R3 increases the dynamic range of the ratiometric signal sensed at the control input terminal of timer 1332 by reducing the voltage across a resistive voltage divider (not shown) inside 555 timer 1332 to equal the ratiometric voltage supplied by ratiometric sensors 1334 and 1335 for example to indicate a neutral position of a movable element in a position sensing controller, when ratiometric sensors 1334 and 1335 are included in the position sensing controller.

In one embodiment, an output signal on pin 3 of microprocessor 1340 (FIG. 13) drives an infrared transmitter 1350. In one embodiment, infrared transmitter 1350 is of the type illustrated in FIG. 10 of copending U.S. patent application Ser. No. 08/076,032(M-2725-2P) filed Jun. 15, 1993, that was incorporated by reference above. Infrared transmitter 1350 modulates an infrared light beam that is transmitted to a conventional infrared receiver (not shown) that in turn demodulates the received signals and uses the demodulated signals to drive an electrically controllable device (e.g., a video game machine or a personal computer). Use of infrared transmitter 1350 in a controller of the type described in U.S. patent application, Ser. No. 08/359,307 results in a wireless joystick that is cheap, accurate and capable of working when pointed in any direction.

Figure 14:
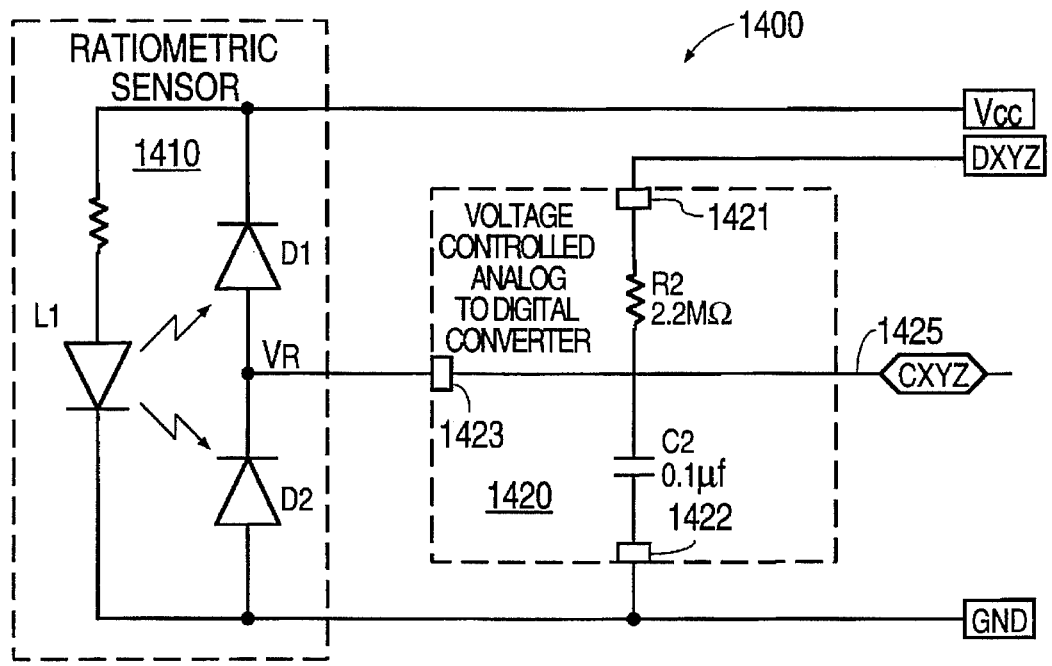
FIGS. 14 and 14A illustrate other embodiments of a balanced ratiometric sensor coupled to a resistor and a capacitor.
Figure 15:
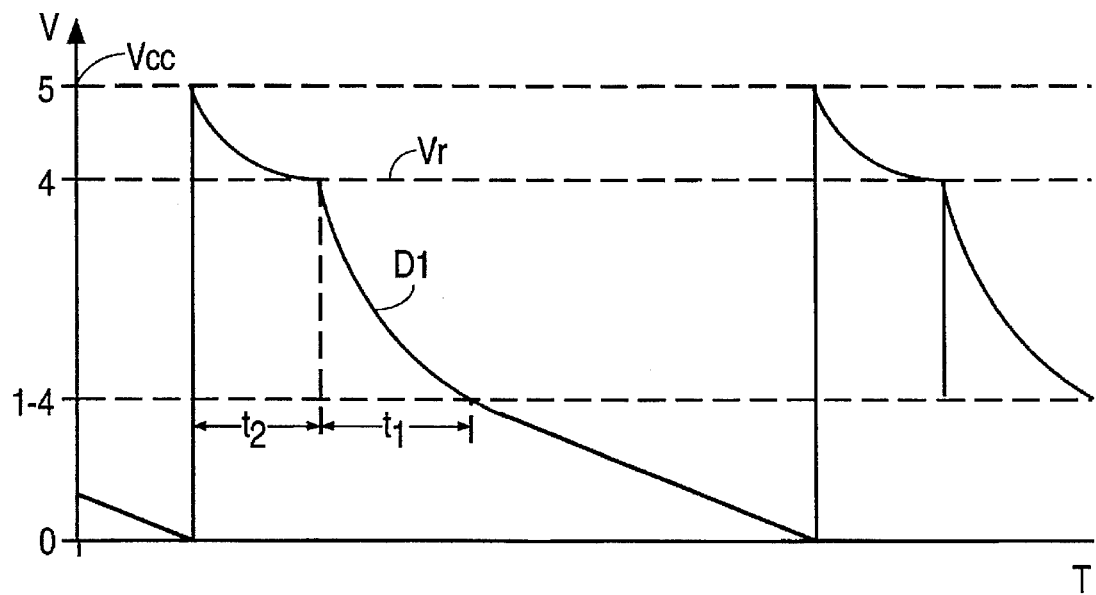
FIG. 15 illustrates a signal generated by a circuit of the type illustrated in FIG. 14.

In another embodiment, in response to an active signal on line 1425 (FIG. 14), that is connected to pin CXYZ, voltage controlled analog-to-digital converter 1420 initially precharges a capacitor C2 (FIG. 14) to supply voltage Vcc. When pin CXYZ becomes a high impedance input pin, voltage controlled analog-to-digital converter 1420 stabilizes the voltage on capacitor C2 to ratiometric sensor 1410's output voltage Vr after a period of time, such as time t2 (FIG. 15). Time t2 is directly proportional to the amount of light received by photodiodes D1 and D2 (FIG. 14). In an embodiment of ratiometric circuit 1410 in which LED L1 is separated from photodiodes D1 and D2 by a distance of approximately one centimeter, time t2 is approximately one millisecond when the movable element is in a neutral position.

Then, in response to an active (e.g. low) trigger signal (e.g. logic 0) at pin DXYZ that is connected to terminal 1421, voltage controlled analog-to-digital converter 1420 supplies a decaying signal D1 (FIG. 15) that has an initial voltage level of ratiometric voltage Vr on line 1425.

Initial voltage Vr of capacitor C2 is measured for a time period t1 (FIG. 15), after which time period a switch coupled to line 1425 changes state, for example, when decaying signal D1 falls below a threshold voltage (typically 1.4 volts) that indicates a change from a high to low signal (e.g. logic 1 to logic 0). Time period t1 is directly proportional to the analog voltage provided by ratiometric sensor 1410, and so allows a microprocessor to sense the ratiometric voltage, with a degree of accuracy limited mainly by the speed of the microprocessor.

Pre-charging of capacitor C2 results in faster sensing of a ratiometric voltage because the time required by a discharging capacitor to reach, for example a threshold voltage is considerably smaller than the time required by a charging capacitor to reach, for example the ratiometric voltage.

Position sensing circuit 1400 (FIG. 14) can be used with a microprocessor 1610 (FIG. 16) as illustrated by position sensing circuit 1600 that is similar to the circuitry in FIG. 11 except that the voltage-controlled analog-to-digital converter includes an RC circuit (of the type illustrated in FIG. 14), rather than a 555 timer.

Figure 14A:
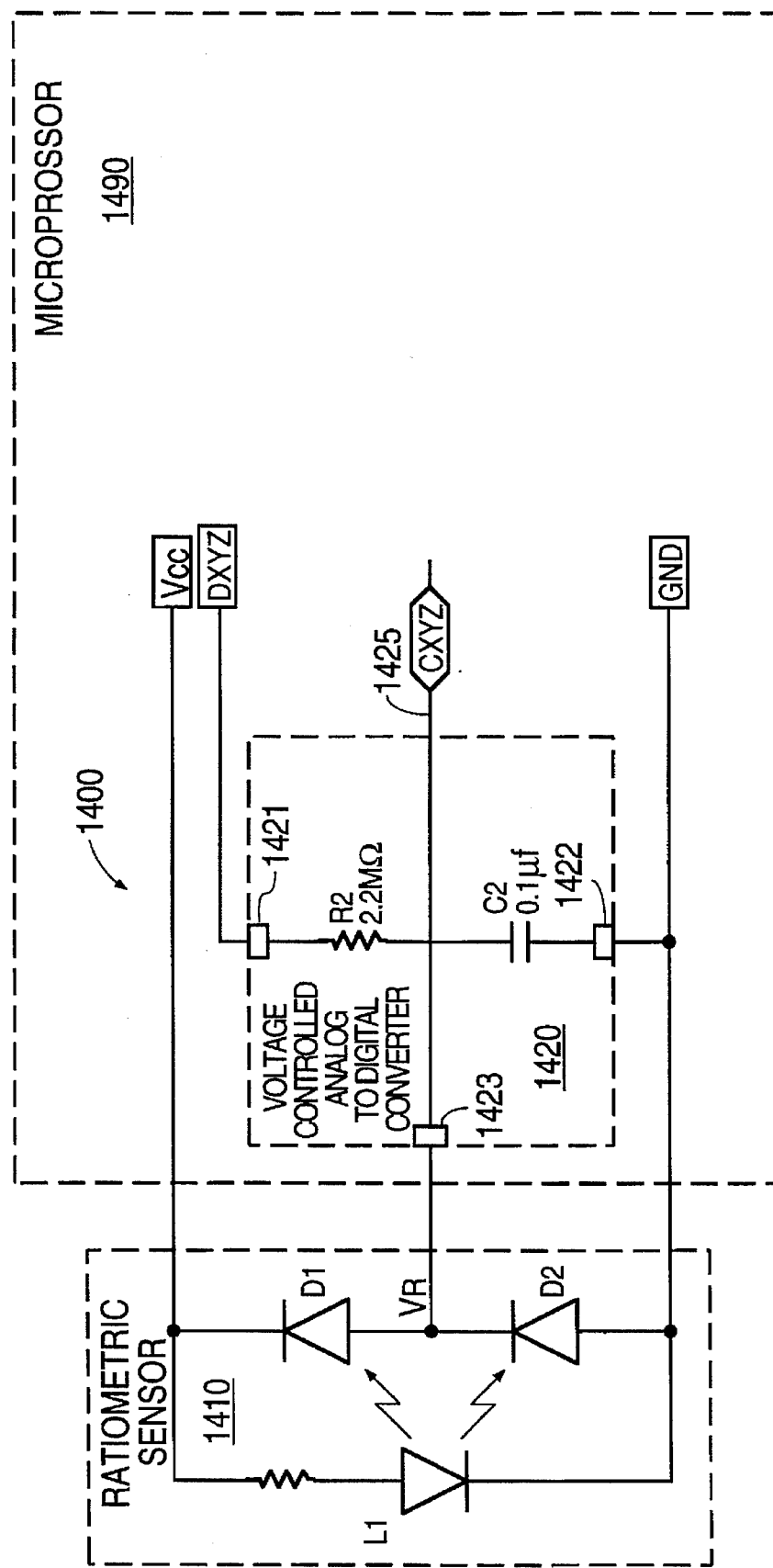

Also, ratiometric sensor 1410 can be coupled to a voltage-controlled analog-to-digital converter 1420 that is formed inside a microprocessor 1490 (FIG. 14A), for example by:
(a) junction capacitor of a gate of a field effect transistor as capacitor C2 (FIG. 14) wherein the gate is connected to a terminal 1423 of a microprocessor 1490 and (b) pull-down resistor that is internal to and connected to a terminal 1421 of the microprocessor as resistor R2 (FIG. 14A). Capacitor C2 (FIG. 14A) can be a junction capacitor of a gate of a field-effect-transistor, wherein the gate is connected to a terminal of microprocessor 1490.

Figure 17:
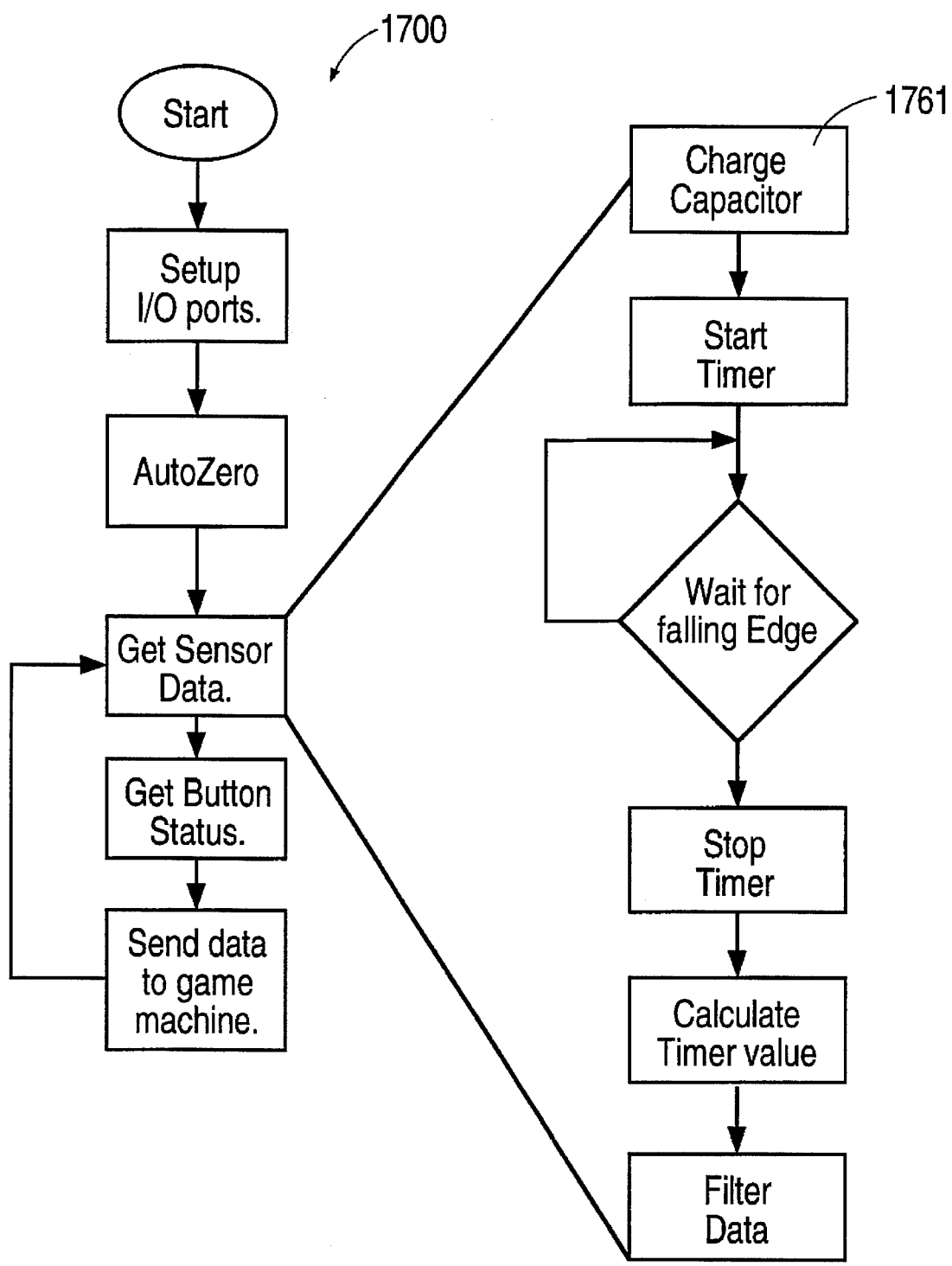
FIG. 17 illustrates a flow chart of the software for use in microcontroller 1610 of FIG. 16.

A process 1700 (FIG. 17) that runs in microprocessor 1610 (FIG. 16) is similar to process 1200 (FIG. 12), except that instead of triggering a 555 timer, process 1700 charges capacitors C2 and C3 in step 1761. Software for process 1700 is listed in Microfiche Appendix B.

The above description is intended to be illustrative and not restrictive. Many variations of the invention will become apparent to those of skill in the art upon review of this disclosure. The scope of the invention should not be determined with reference to the above description. Various embodiments are encompassed by the appended claims along with their full scope of equivalents.

We claim:

1. A circuit comprising:

a ratiometric sensor comprising a signal sensor, a first reference voltage line, a second reference voltage line and a ratiometric sensor output line, said ratiometric sensor having a first equivalent resistance between said first reference voltage line and said ratiometric sensor output line, said ratiometric sensor further having a second equivalent resistance between said second reference voltage line and said ratiometric sensor output line; and a voltage controlled current amplifier consisting essentially of:

a pnp transistor having a base, a collector and an emitter, said base being coupled to said ratiometric sensor output line;

a first resistor coupled between said first reference voltage line and said emitter to thereby limit current supplied at said collector; and a second resistor coupled between said first reference voltage line and said collector to thereby allow current to be supplied at said collector when said pnp transistor is off.

2. The circuit of claim 1 further comprising a Darlington pair wherein said pnp transistor is included in said Darlington pair.

3. The circuit of claim 1 comprising a plurality of ratiometric sensors for detection of movement along a plurality of axes.

4. The circuit of claim 1 wherein:
   the first reference voltage line, the second reference voltage line and the collector are coupled to a game port of a personal computer.

5. The circuit of claim 1 wherein:
   the ratiometric sensor comprises a potentiometer coupled between the first reference voltage line and the ratiometric sensor output line; and
   the signal sensor is coupled between the second reference voltage line and the ratiometric sensor output line.

6. The circuit of claim 5 wherein the signal sensor comprises a photosensitive element.

7. The circuit of claim 6 wherein the photosensitive element is a photodiode.

8. The circuit of claim 7 wherein a cathode of the photodiode is coupled to the ratiometric sensor output line.

9. The circuit of claim 5 further comprising a light emitting diode, wherein the light emitting diode generates light incident on the photosensitive element.

10. The circuit of claim 9 wherein the light emitting diode has two terminals:
    a first terminal coupled to the first reference voltage line; and
    a second terminal coupled to the second reference voltage line.

11. The circuit of claim 1 wherein:
    the ratiometric sensor comprises an electronic component coupled between the first reference voltage line and the ratiometric sensor output line; and
    the signal sensor is coupled between the second reference voltage line and the ratiometric sensor output line.

12. The circuit of claim 11 wherein the signal sensor comprises a photosensitive element.

13. The circuit of claim 12 wherein the photosensitive element is a photodiode.

14. The circuit of claim 13 wherein a cathode of the photodiode is coupled to the ratiometric sensor output line.

15. The circuit of claim 12 further comprising a light emitting diode, wherein the light emitting diode generates light incident on the photosensitive element.

* * * * *